US011637125B2

(12) United States Patent
Lee et al.

(10) Patent No.: US 11,637,125 B2
(45) Date of Patent: Apr. 25, 2023

(54) MEMORY DEVICE

(71) Applicant: MACRONIX International Co., Ltd., Hsinchu (TW)

(72) Inventors: Chien-Ying Lee, New Taipei (TW); Chih-Hsiung Lee, Hsinchu (TW); Tzung-Ting Han, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 296 days.

(21) Appl. No.: 17/075,480

(22) Filed: Oct. 20, 2020

(65) Prior Publication Data
US 2022/0123009 A1    Apr. 21, 2022

(51) Int. Cl.
*H01L 27/11582* (2017.01)
*H01L 27/11519* (2017.01)
*H01L 27/11565* (2017.01)
*H01L 27/11556* (2017.01)

(52) U.S. Cl.
CPC .. *H01L 27/11582* (2013.01); *H01L 27/11519* (2013.01); *H01L 27/11556* (2013.01); *H01L 27/11565* (2013.01)

(58) Field of Classification Search
CPC ..................... H01L 27/11578; H01L 27/11582
See application file for complete search history.

(56) References Cited

U.S. PATENT DOCUMENTS

| 9,735,170 | B2 | 8/2017 | Chae et al. | |
|---|---|---|---|---|
| 9,870,991 | B1 | 1/2018 | Kim et al. | |
| 10,381,371 | B2 | 8/2019 | Ogawa et al. | |
| 10,580,795 | B1 | 3/2020 | Luo et al. | |
| 2018/0102314 | A1* | 4/2018 | Kim | H01L 27/11582 |
| 2020/0258901 | A1* | 8/2020 | Choi | H01L 27/11582 |
| 2020/0388624 | A1* | 12/2020 | Baek | H01L 27/11575 |

FOREIGN PATENT DOCUMENTS

CN    111564446    8/2020

OTHER PUBLICATIONS

"Office Action of Taiwan Counterpart Application", dated May 7, 2021, p. 1-p. 7.

* cited by examiner

*Primary Examiner* — Christopher A Johnson
(74) *Attorney, Agent, or Firm* — J.C. Patents

(57) ABSTRACT

Provided is a memory device including a substrate, a stack structure on the substrate, a contact, and a supporting pillar. The stacked structure includes a plurality of conductive layers and a plurality of insulating layers stacked alternately on each other. The contact is connected to one of the plurality of conductive layers of the stack structure. The supporting pillar penetrates the stack structure and is disposed around the contact. The supporting pillar includes a body portion and a plurality of extension portions. The body portion is arranged around a first side of the contact. The plurality of extension portions are located on two sides of the body portion. A length of each of the extension portions is greater than a width of the contact, and one of the extension portions is disposed around a second side of the contact.

20 Claims, 32 Drawing Sheets

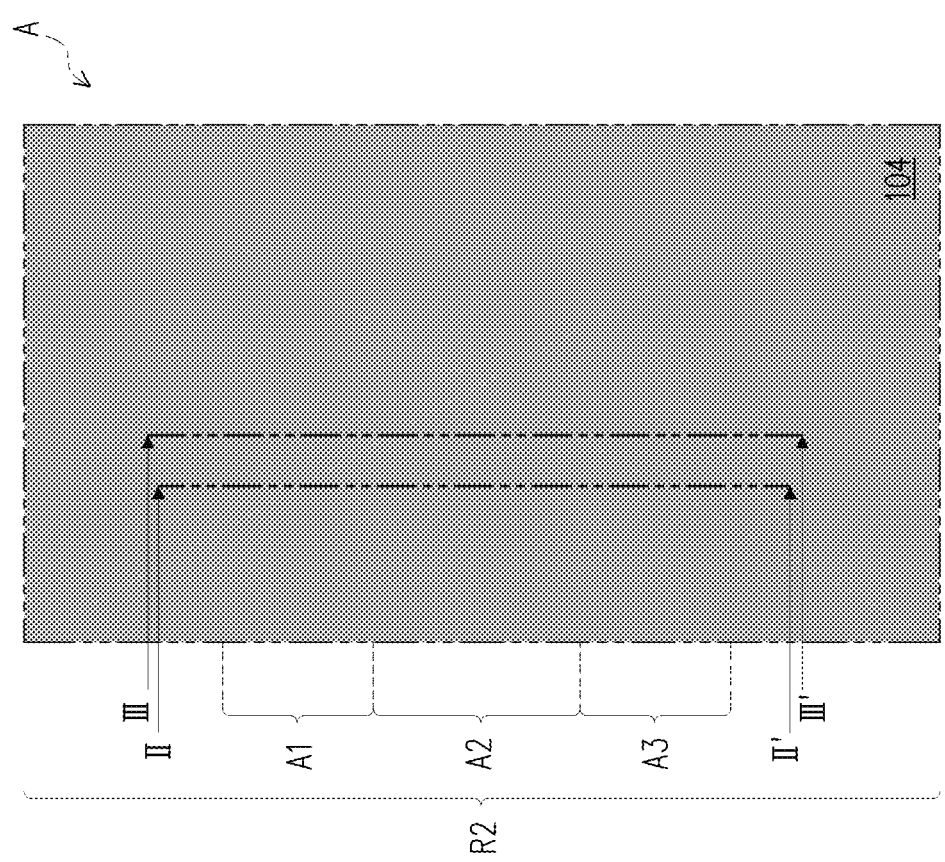

MEMORY DEVICE

BACKGROUND

Technical Field

The embodiment of the disclosure relates to a semiconductor device and a fabrication method thereof, and particularly, to a memory device and a fabrication method thereof.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

SUMMARY

The disclosure provides a memory device in which supporting pillars disposed in a stack structure may prevent remaining sacrificial layers from being over-etched in the process of removing sacrificial layers to form horizontal openings for manufacturing gate layers.

In an embodiment of the disclosure, a memory device includes a substrate, a stack structure, a first contact, and a first supporting pillar. The stack structure is located on the substrate. The stack structure includes a plurality of conductive layers and a plurality of insulating layers stacked alternately on each other. The first contact is connected to one of the plurality of conductive layers of the stack structure. The first supporting pillar penetrates the stack structure and is disposed around a first side and a second side of the first contact. The first supporting pillar includes a first body portion and a plurality of first extension portions. The first body portion is disposed around the first side of the first contact. The plurality of first extension portions are located on two sides of the first body portion. A length of each of the first extension portions is greater than a width of the first contact, and a first portion of the plurality of first extension portions is disposed around the second side of the first contact.

In an embodiment of the disclosure, a memory device includes a substrate, a stack structure, a plurality of first contacts, and a plurality of first supporting pillars. The substrate includes a memory array region and a staircase region. The staircase region includes a first zone and a second zone. The stack structure is located on the memory array region and the staircase region of the substrate. The stack structure in the memory array region and the first zone of the staircase region includes a plurality of conductive layers and a plurality of insulating layers stacked alternately on each other, and the stack structure in the second zone of the staircase region includes a plurality of sacrificial layers and the plurality of insulating layers stacked alternately on each other. The plurality of first contacts penetrate the stack structure of the second zone and are electrically connected to the substrate. The plurality of first supporting pillars are disposed apart from each other by a non-zero distance at a boundary between the first zone and the second zone and penetrate the stack structure. The plurality of sacrificial layers of the stack structure of the second zone between two adjacent first supporting pillars are in contact with the plurality of conductive layers of the stack structure of the first zone.

Based on the above, through the structure and the layout design of the supporting pillars, it is possible to effectively control the etching amount of the sacrificial layers. Therefore, the complexity of the manufacturing process may be reduced.

To make the aforementioned more comprehensible, several embodiments accompanied with drawings are described in detail as follows.

BRIEF DESCRIPTION OF THE DRAWINGS

FIG. 1A to FIG. 6A are schematic cross-sectional views of a memory array region in a method of fabricating a three-dimensional memory device according to an embodiment of the disclosure.

FIG. 1B to FIG. 6B are top views of a staircase region in a three-dimensional memory device according to an embodiment of the disclosure.

FIG. 1C to FIG. 6C are schematic cross-sectional views of a staircase region in a method of fabricating a three-dimensional memory device according to an embodiment of the disclosure.

FIG. 1D to FIG. 6D are other schematic cross-sectional views of a staircase region in a method of fabricating a three-dimensional memory device according to an embodiment of the disclosure.

FIG. 1E to FIG. 3E are top views of a method of fabricating a three-dimensional memory device according to an embodiment of the disclosure.

FIG. 4E to FIG. 6E are top views of a staircase region in partial stages of a method of fabricating a three-dimensional memory device according to another embodiment of the disclosure.

DESCRIPTION OF THE EMBODIMENTS

Figure 1A:
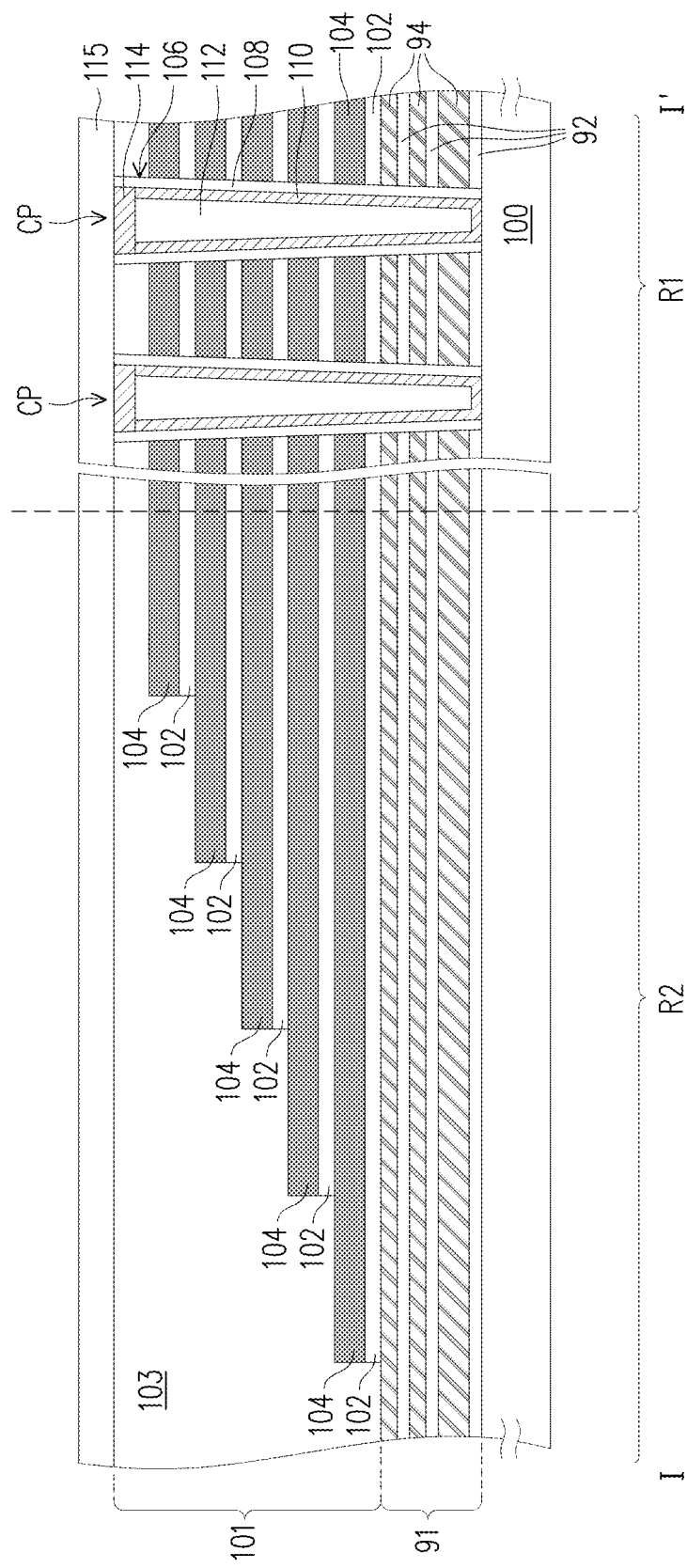
Figure 1C:
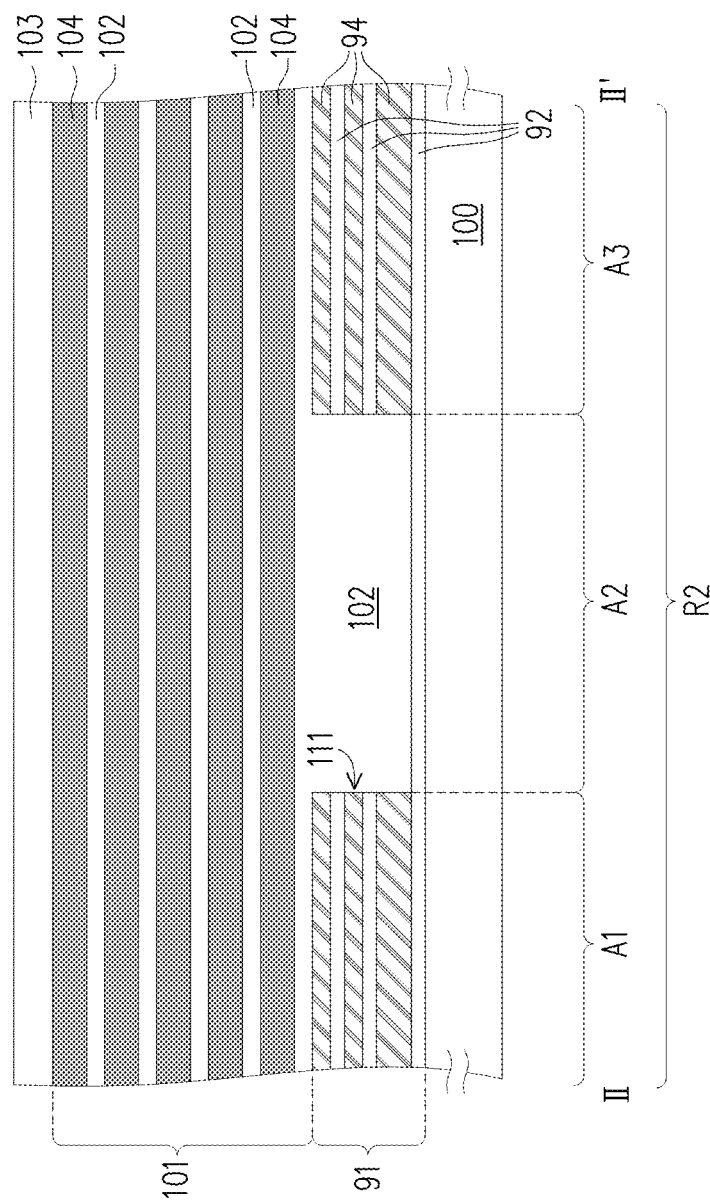
Figure 1D:
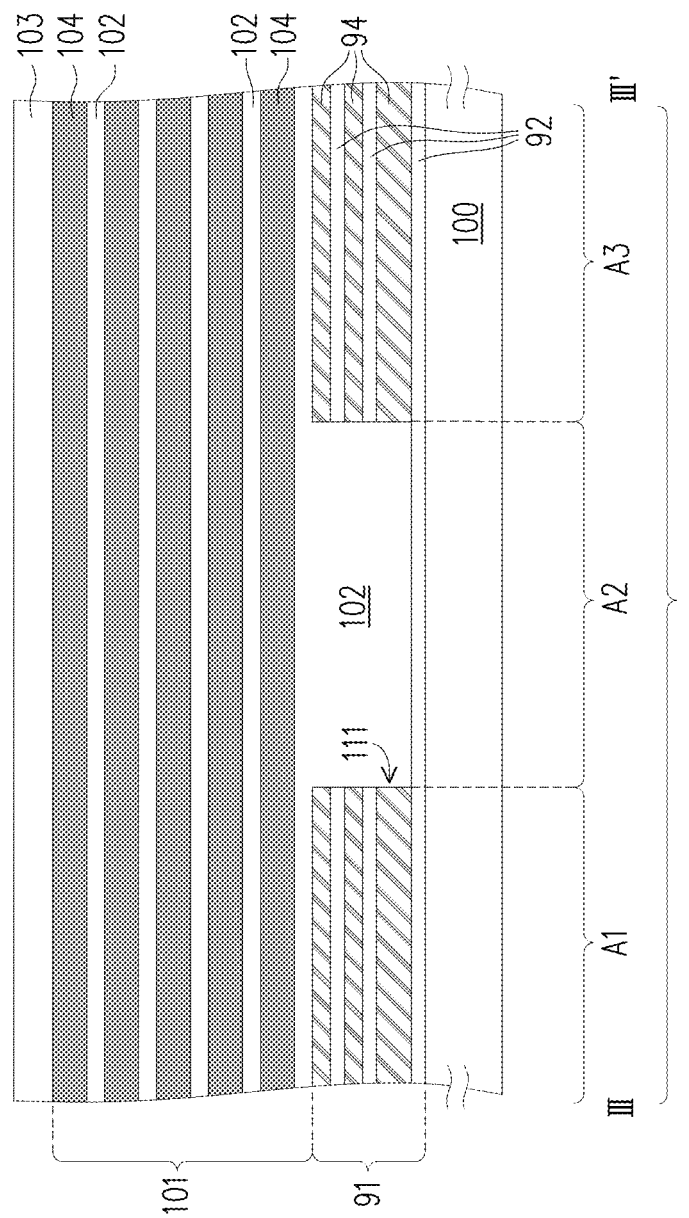
Figure 1E:
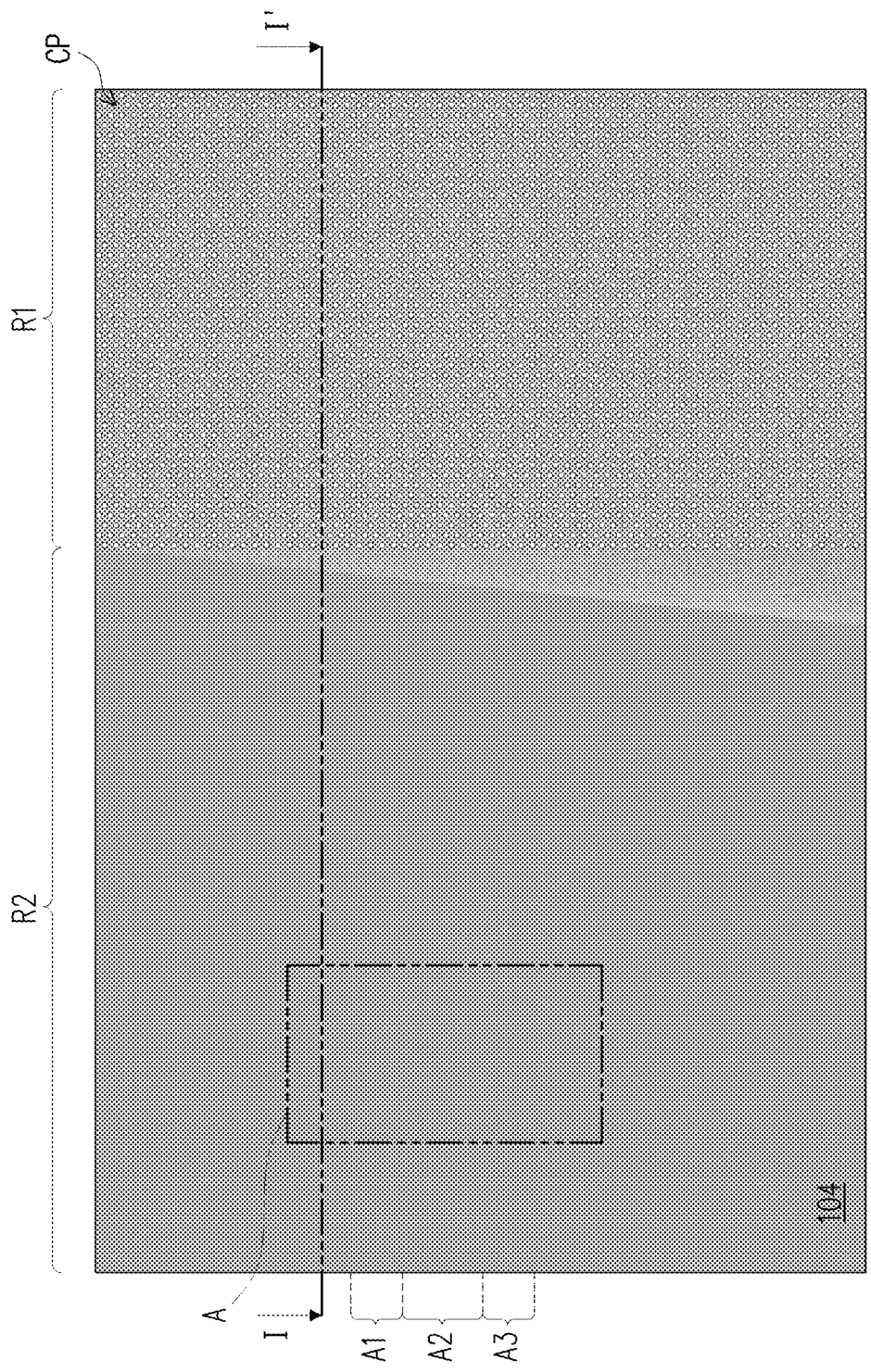

FIG. 1E is a top view of a three-dimensional memory device. FIG. 1A is a schematic cross-sectional view taken along line I-I' of FIG. 1E. FIG. 1B is an enlarged view of a zone A in FIG. 1E. FIG. 1C is a schematic cross-sectional view taken along line II-II' of FIG. 1B. FIG. 1D is a schematic cross-sectional view taken along line III-III' of FIG. 1B. For clarity, the material layers above an uppermost sacrificial layer 104 are omitted in FIG. 1B and FIG. 1E.

Referring to FIG. 1A to FIG. 1E, a substrate 100 is provided. The substrate 100 may be a semiconductor substrate, such as a silicon-containing substrate. In an embodiment, according to the design requirements, a doped region may be formed in the substrate 100. In an embodiment, the substrate 100 has a memory array region R1 and a staircase region R2 (as shown in FIG. 1A and FIG. 1E). The staircase region R2 includes a first zone A1, a second zone A2, and a third zone A3 (as shown in FIG. 1B to FIG. 1D). A device layer (not shown) and a metal interconnect structure (not shown) are formed on the substrate 100. The device layer may include an active device or a passive device. The active device is, for example, a transistor, a diode, etc. The passive device is, for example, a capacitor, an inductor, etc. The metal interconnect structure may include a dielectric layer, a plug, a wire, etc.

Referring to FIG. 1A, FIG. 1C, and FIG. 1D, a stack structure 101 is formed on the substrate 100. In an embodiment, the stack structure 101 is located on the memory array region R1 and the staircase region R2. In an embodiment, the stack structure 101 includes a plurality of insulating layers 102 and a plurality of sacrificial layers 104 stacked alternately on each other. In an embodiment, the material of the insulating layer 102 includes silicon oxide, and the material of the sacrificial layer 104 includes silicon nitride. In an embodiment, the sacrificial layer 104 and the insulating layer 102 extend from the memory array region R1 to the staircase region R2. The end portions of the sacrificial layers 104 and the insulating layers 102 in the staircase region R2 form a staircase structure.

Referring to FIGS. 1C and 1D, in another embodiment, another stack structure 91 is further provided between the substrate 100 and the stack structure 101. The stack structure 91 includes a plurality of insulating layers 92 and a plurality of conductive layers 94 stacked alternately on each other. In the second zone A2, the plurality of insulating layers 92 and the plurality of conductive layers 94 are removed to form a groove 111, so that the lowermost insulating layer 102 of the stack structure 101 which is subsequently formed is filled into the groove 111. In an embodiment, the material of the insulating layer 92 includes silicon oxide, and the material of the conductive layer 94 includes doped polysilicon. As shown in FIG. 1A, the stack structure 91 extends from the memory array region R1 to the staircase region R2, and protrudes beyond the end portions of the lowermost sacrificial layer 104 and insulating layer 102 of the stack structure 101.

Next, referring to in FIG. 1A (also shown in FIG. 1C and FIG. 1D), a dielectric layer 103 is formed on the substrate 100 to cover the stack structure 101 of the memory array region R1 and the staircase structure on the staircase region R2. Afterwards, as shown in FIG. 1A, a patterning process is performed to remove part of the stack structure 101 and the stack structure 91 in the memory array region R1 to form one or more openings 106 passing through the stack structure 101 and the stack structure 91. In an embodiment, the opening 106 may have a slightly inclined sidewall, as shown in FIG. 1A. In another embodiment, the opening 106 may have a substantially vertical sidewall (not shown). In an embodiment, the opening 106 is also referred to as a vertical channel (VC) hole. Then, a vertical channel pillar CP is formed in the opening 106. The vertical channel pillar CP may be formed as described below.

Referring to in FIG. 1A, a charge storage structure 108 is formed on the sidewall of the opening 106. The charge storage structure 108 is in contact with the insulating layers 102 and the sacrificial layers 104. In an embodiment, the charge storage structure 108 is an oxide/nitride/oxide (ONO) composite layer. In an embodiment, the charge storage structure 108 is formed on the sidewall of the opening 106 in the form of a spacer and the bottom surface of the opening 106 is exposed.

Then, referring to in FIG. 1A, a channel layer 110 is formed on the charge storage structure 108. In an embodiment, the material of the channel layer 110 includes polysilicon. In an embodiment, the channel layer 110 covers the charge storage structure 108 on the side walls of the opening 106, and the channel layer 110 is also exposed from the bottom surface of the opening 106. Next, an insulating pillar 112 is formed in the lower portion of the opening 106. In an embodiment, the material of the insulating pillar 112 includes silicon oxide. Afterwards, a conductive plug 114 is formed in the upper portion of the opening 106, and the conductive plug 114 is in contact with the channel layer 110. In an embodiment, the material of the conductive plug 114 includes polysilicon. The channel layer 110 and the conductive plug 114 may be collectively referred to as a vertical channel pillar CP. The charge storage structure 108 surrounds a vertical external surface of the vertical channel pillar CP. Next, an insulating cap layer 115 is formed on the stack structure 101. In an embodiment, the material of the insulating cap layer 115 includes silicon oxide.

Figure 2A:
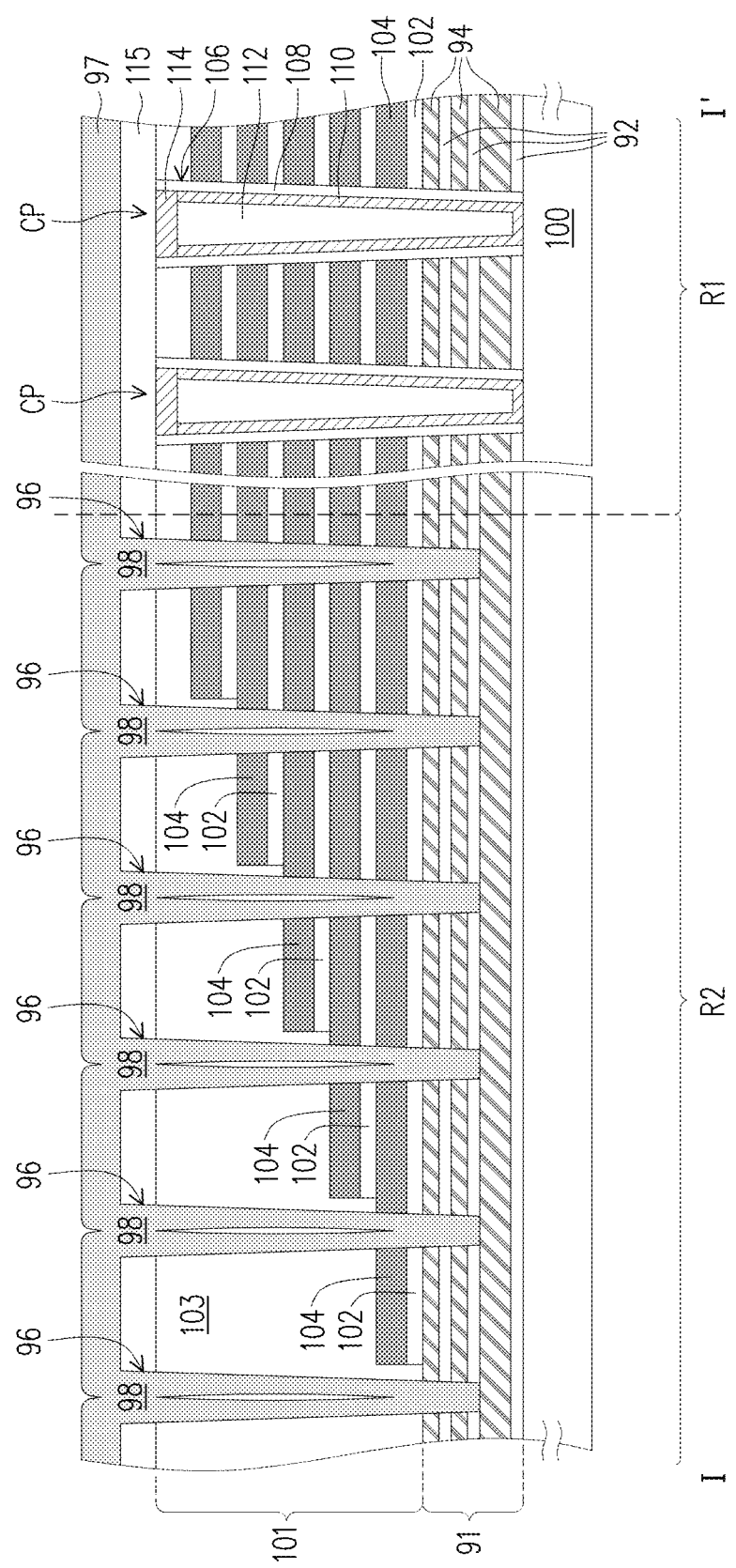
Figure 2B:
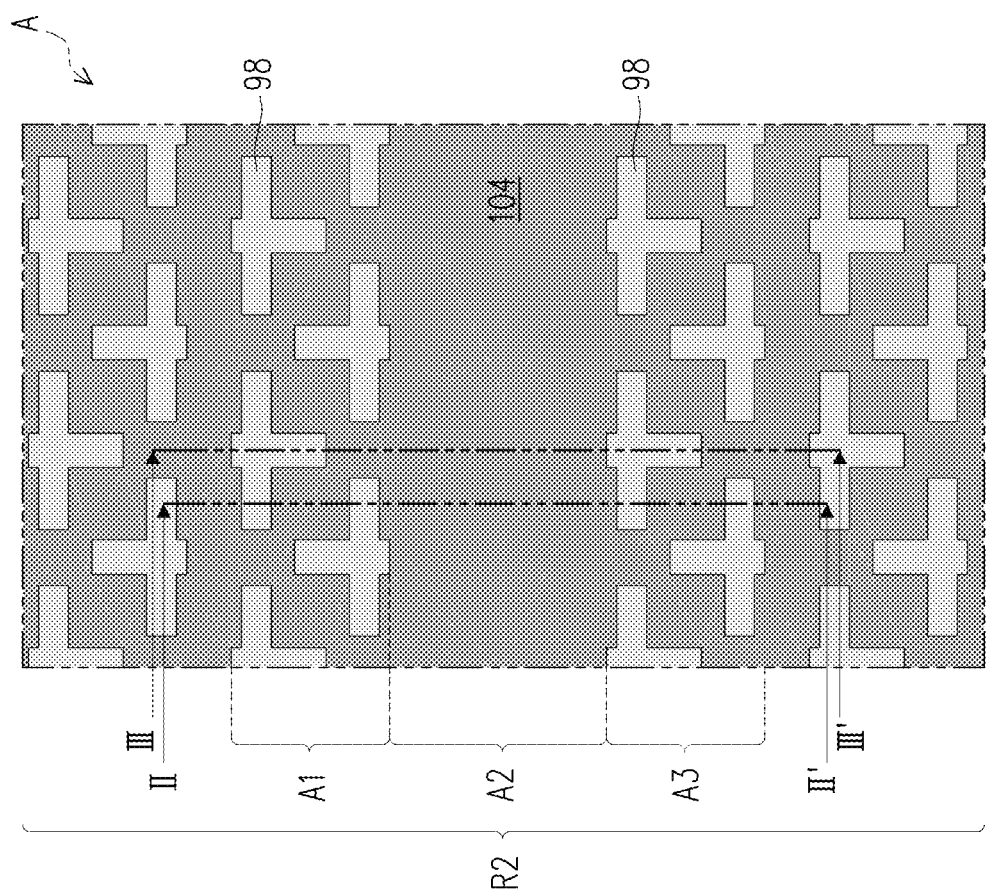
Figure 2C:
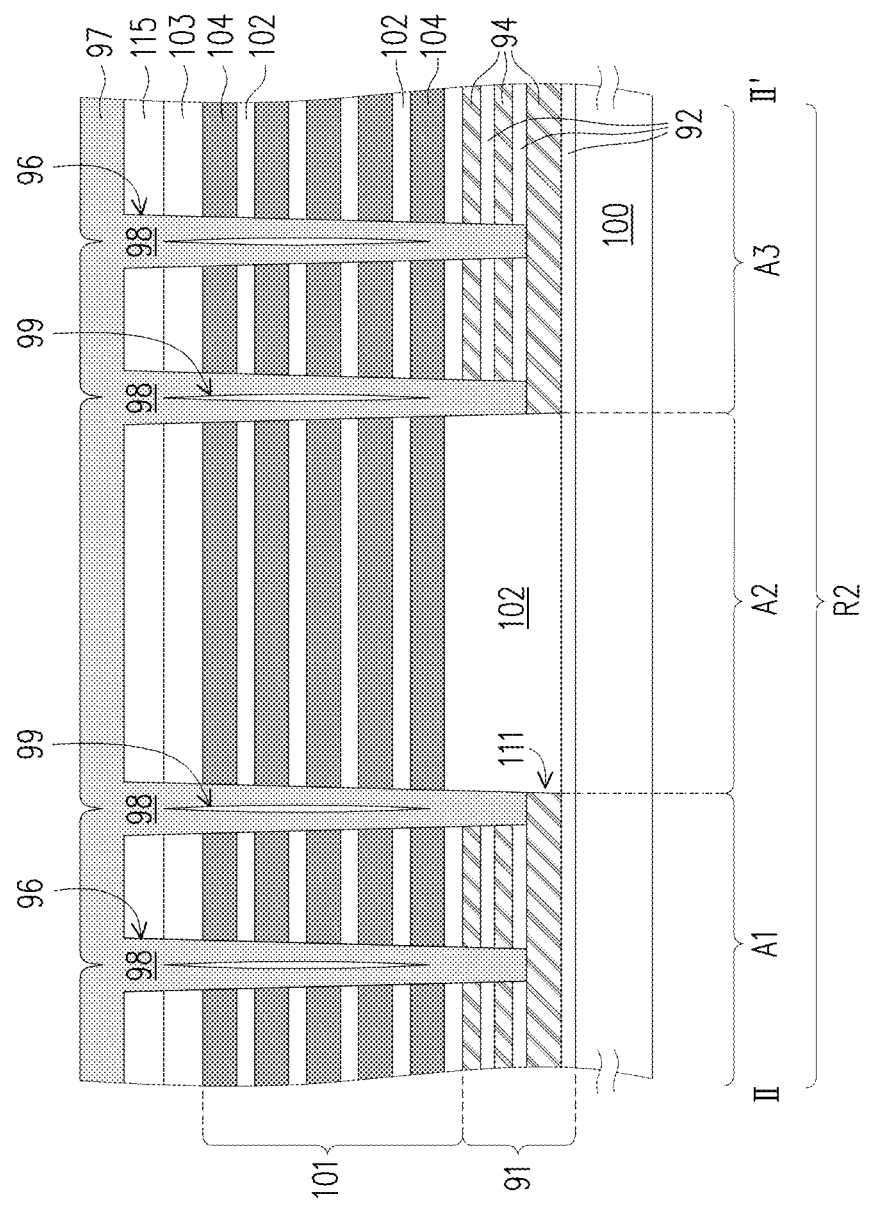
Figure 2D:
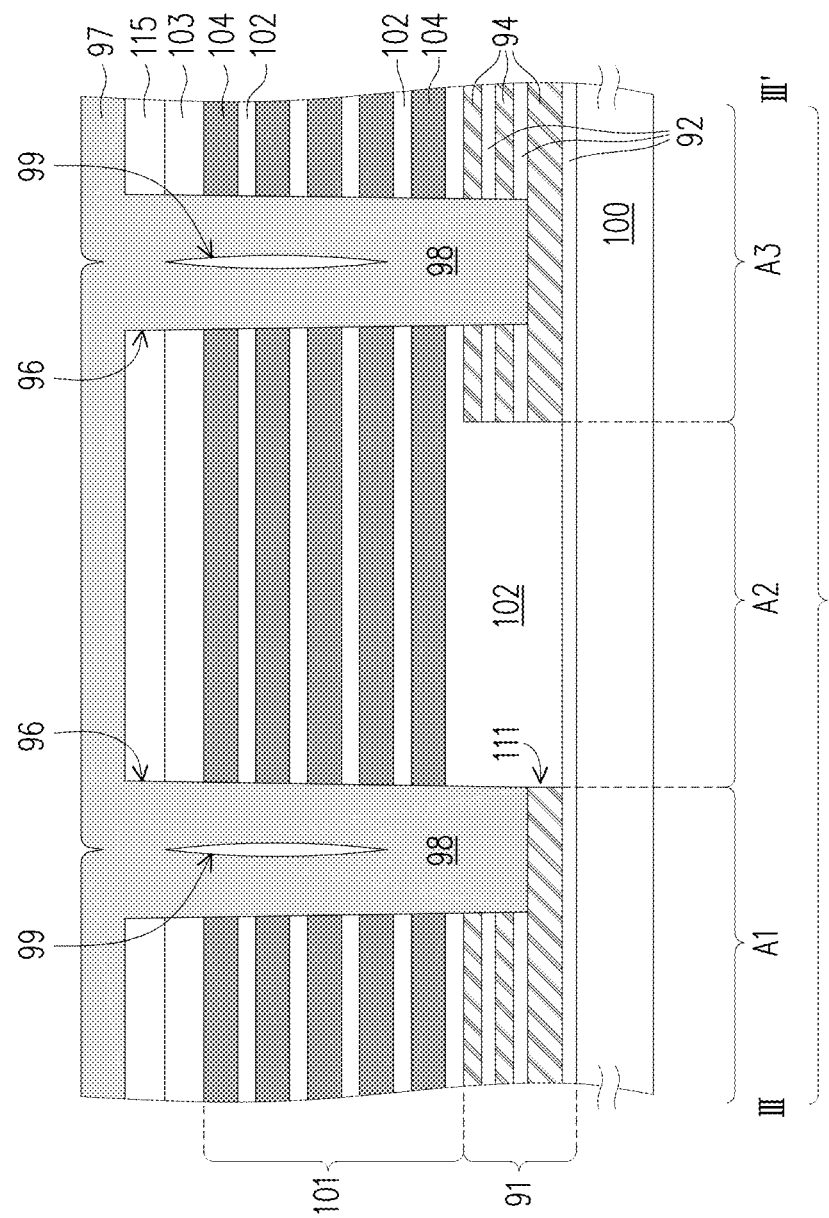
Figure 2E:
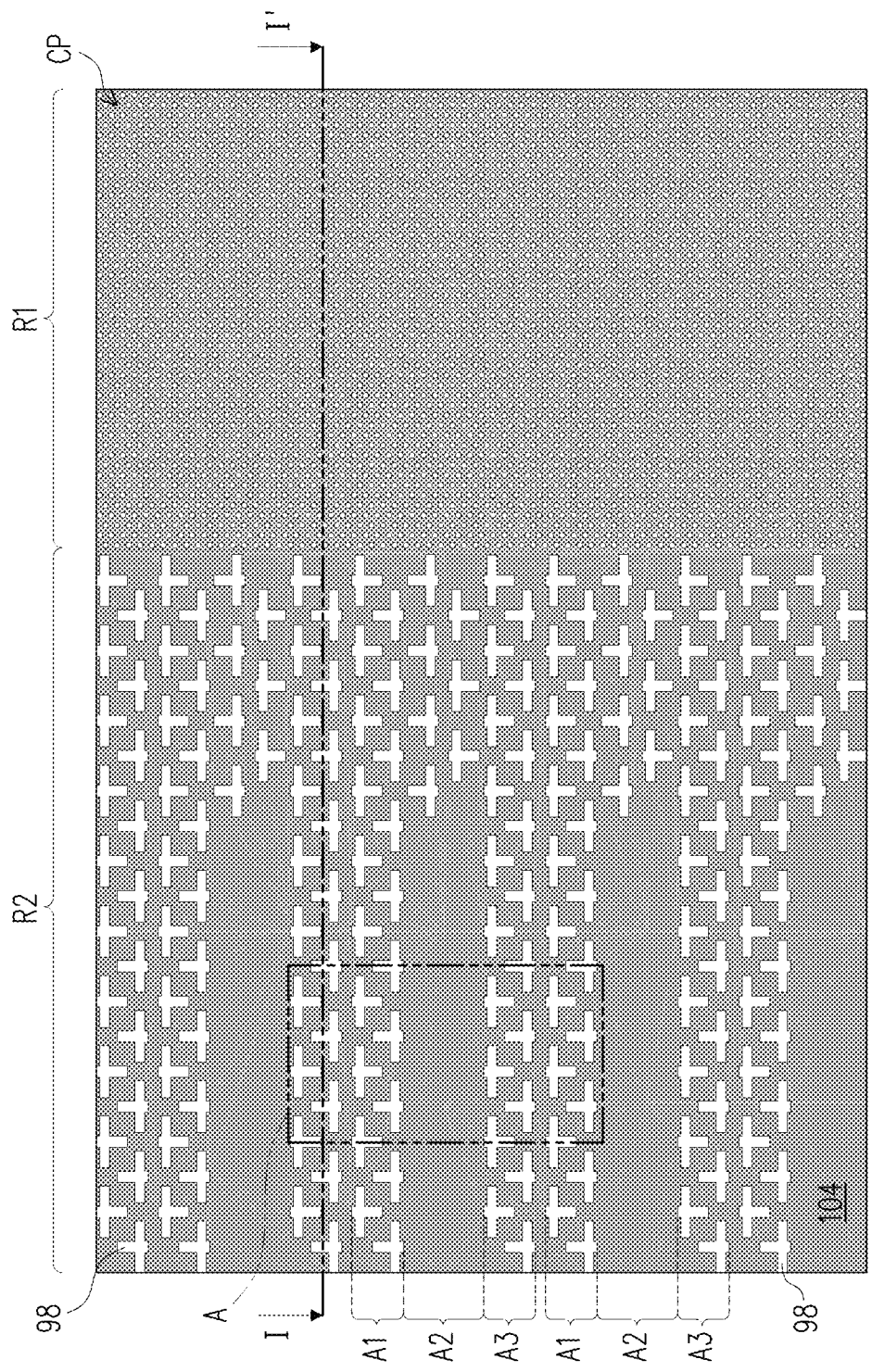
Figure 2F:
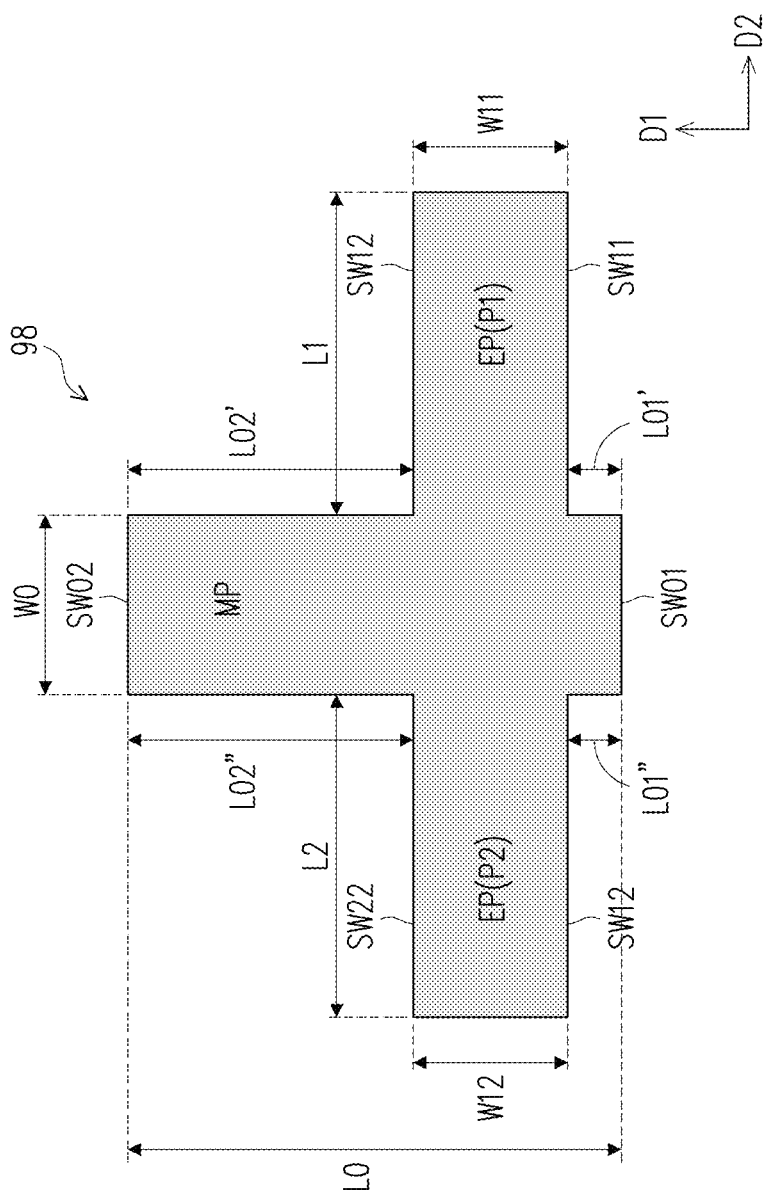
FIG. 2F is a top view of a supporting structure according to an embodiment of the disclosure.

FIG. 2E is a top view of a three-dimensional memory device. FIG. 2A is a schematic cross-sectional view taken along line I-I' of FIG. 2E. FIG. 2B is an enlarged view of a zone A in FIG. 2E. FIG. 2C is a schematic cross-sectional view taken along line II-II' of FIG. 2B. FIG. 2D is a schematic cross-sectional view taken along line III-III' of FIG. 2B. FIG. 2F is an enlarged view of a supporting structure. For clarity, the material layers above the uppermost sacrificial layer 104 are omitted in FIG. 2B and FIG. 2E.

Referring to FIG. 2A, 2C and FIG. 2D, a patterning process is performed to remove the insulating cap layer 115, part of the stack structure 101, and part of the stack structure 91 in the first zone A1 and the third zone A3 of the staircase region R2, so as to form a plurality of openings 96 passing through the insulating cap layer 115 and the stack structure 101 and passing through part of the stack structure 91. In an embodiment, the opening 96 may have a slightly inclined sidewall, as shown in FIG. 2A. In another embodiment, the opening 96 may have a substantially vertical sidewall (not shown).

Then, referring to FIGS. 2A to 2F, an insulating layer 97 is formed on the insulating cap layer 115 and in the openings 96, as shown in FIGS. 2A, 2C and 2D. The insulating layer 97 in the opening 96 may fill up the opening 96 or form a void 99 in the opening 96, as shown in FIG. 2C. In an embodiment, the material of the insulating layer 97 includes silicon oxide. The insulating layer 97 in the opening 96 may also be referred to as a supporting pillar 98, as shown in FIGS. 2A to 2E. The supporting pillar 98 may prevent the stack structure 101 from collapsing in subsequent manufacturing processes.

Referring to FIG. 2F, the supporting pillar 98 includes a body portion MP and a plurality of extension portions EP. The extending directions of the body portion MP and the extension portions EP are different. For example, the body portion MP extends along a direction D1, and the extension portions EP extend along a direction D2. The direction D1 and the direction D2 are, for example, perpendicular to each other. The extension portions EP include a first portion P1 and a second portion P2, which are respectively located on two sides of the body portion MP. The shape of the supporting pillar 98 is, for example, a cross-shape, a T-shape, or a combination thereof.

Referring to FIG. 2F, a width W0 of the body portion MP of the supporting pillar 98 is, for example, 50 nm to 300 nm, and a length L0 is, for example, 150 nm to 1000 nm. A length L1 of the first portion P1 of the extension portions EP and a length L2 of the second portion P2 of the extension portions EP may be the same or different. A width W11 of the first portion P1 of the extension portions EP and a width W12 of the second portion P2 of the extension portions EP may be the same or different. The widths W11 and W12 are, for example, 50 nm to 300 nm.

Referring to FIG. 2F, a distance (length) L01' between a sidewall SW01 of the body portion MP and a sidewall SW11 of the first portion P1 of the extension portions EP, and a distance (length) L01" between the sidewall SW01 of the body portion MP and a sidewall SW21 of the second portion P2 of the extension portions EP may be the same or different. The distance L01' and the distance L01" are, for example, 0 to 200 nm.

Referring to FIG. 2F, the distance (length) L02' between a sidewall SW02 of the body portion MP and a sidewall SW12 of the first portion P1 of the extension portions EP, and a distance (length) L02" between the sidewall SW02 of the body portion MP and a sidewall SW22 of the second portion P2 of the extension portions EP may be the same or different. The distance L02' and the distance L02" are, for example, less than 500 nm.

Figure 3A:
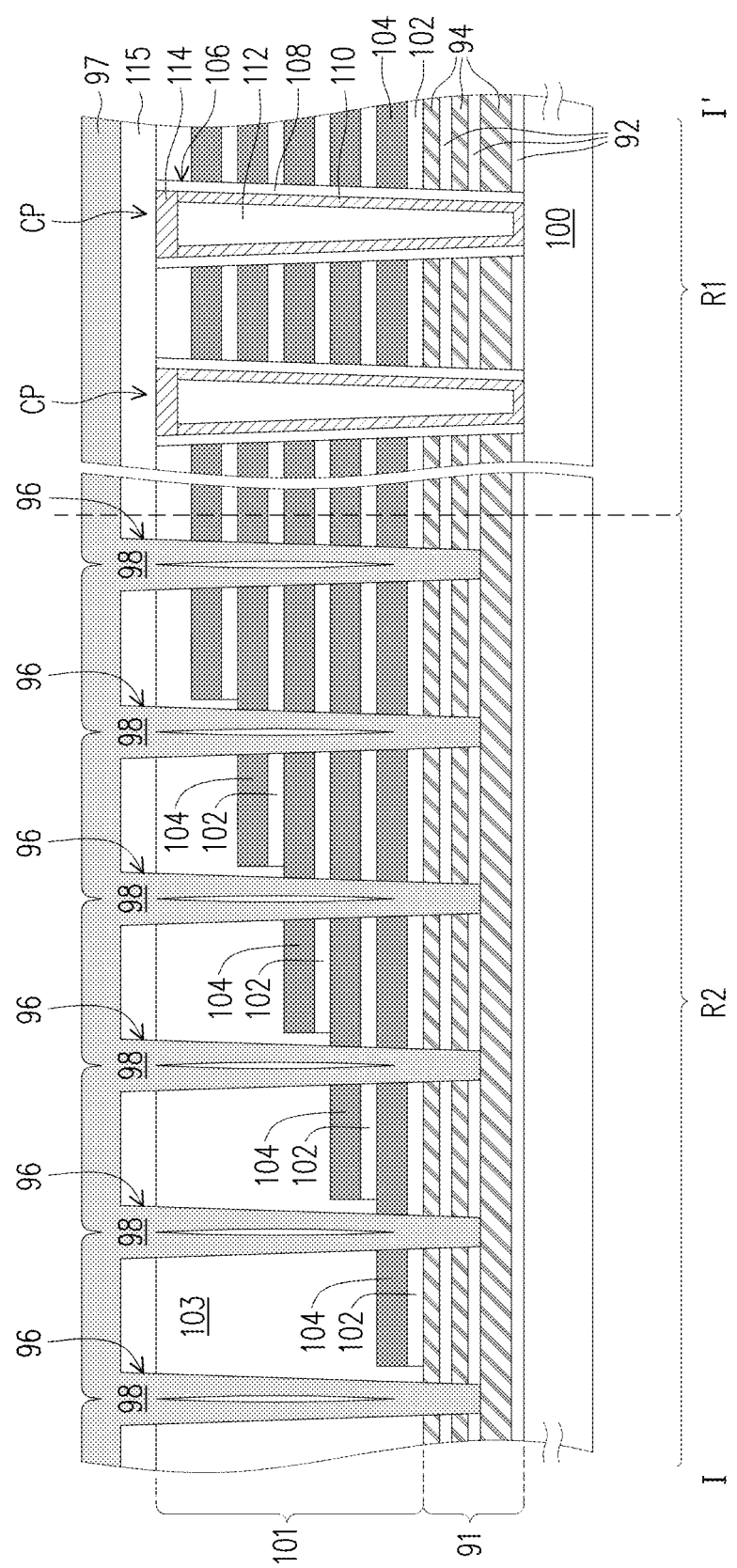
Figure 3B:
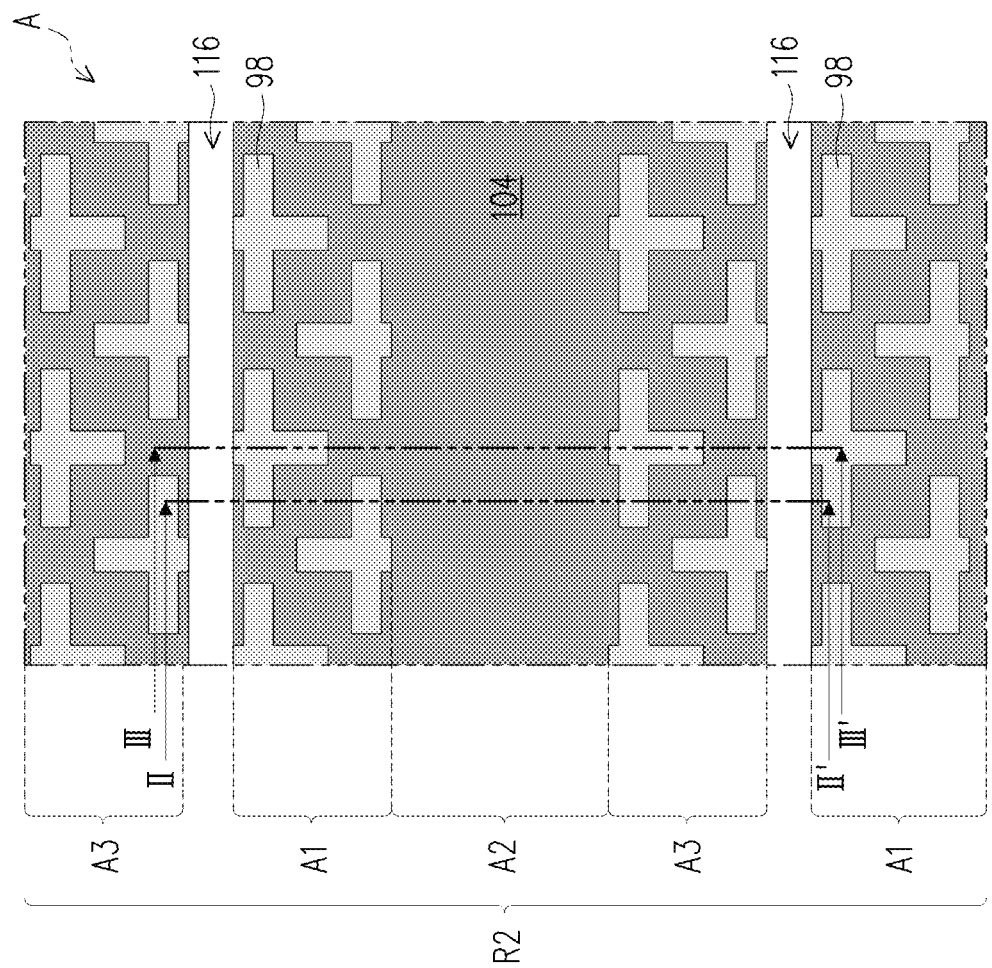
Figure 3C:
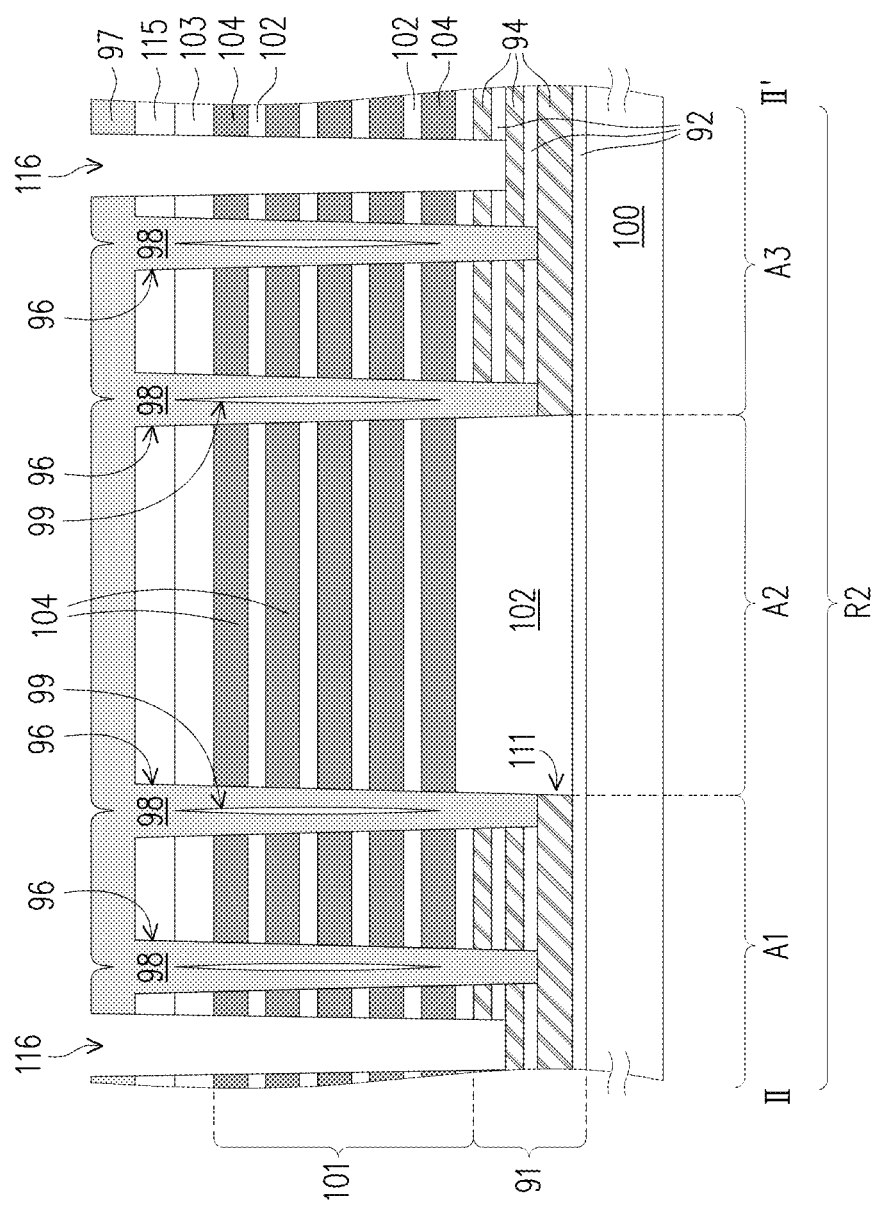
Figure 3D:
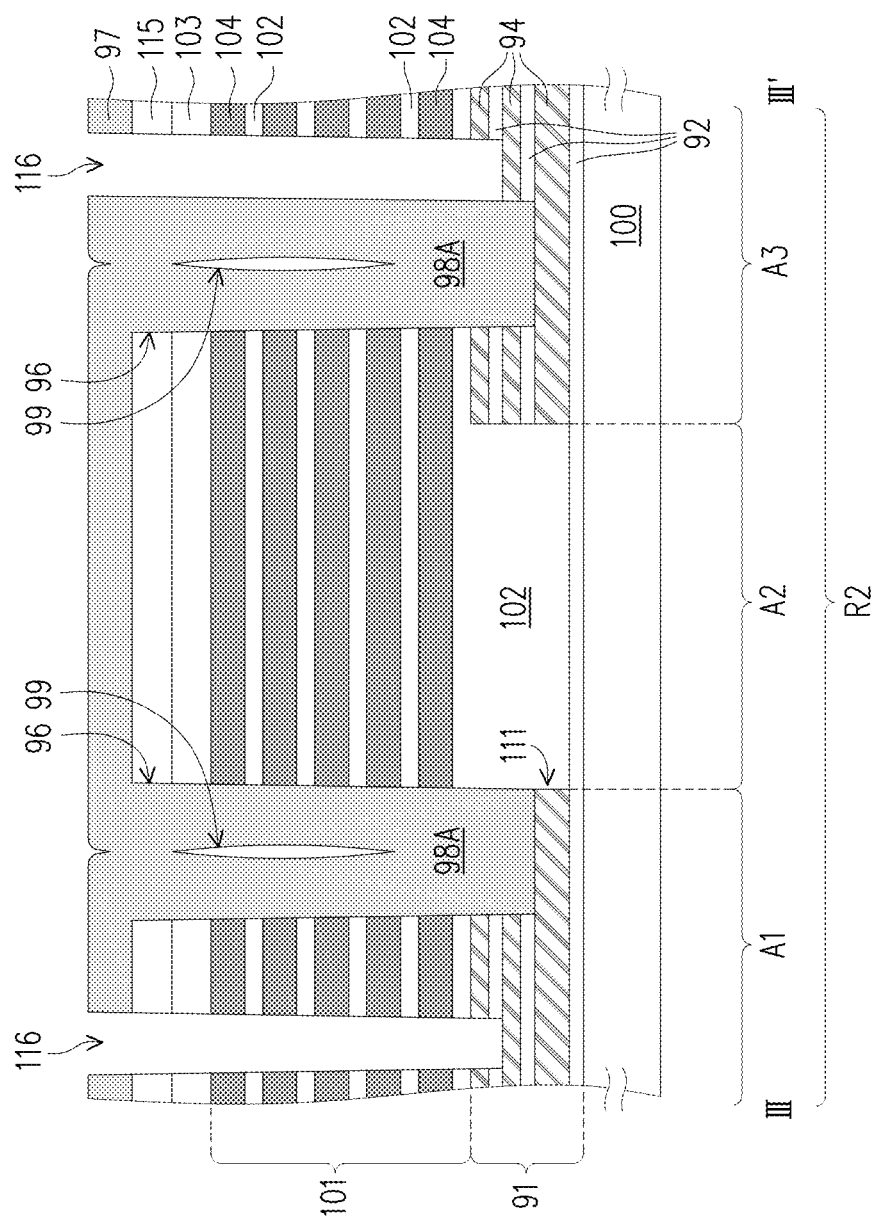
Figure 3E:
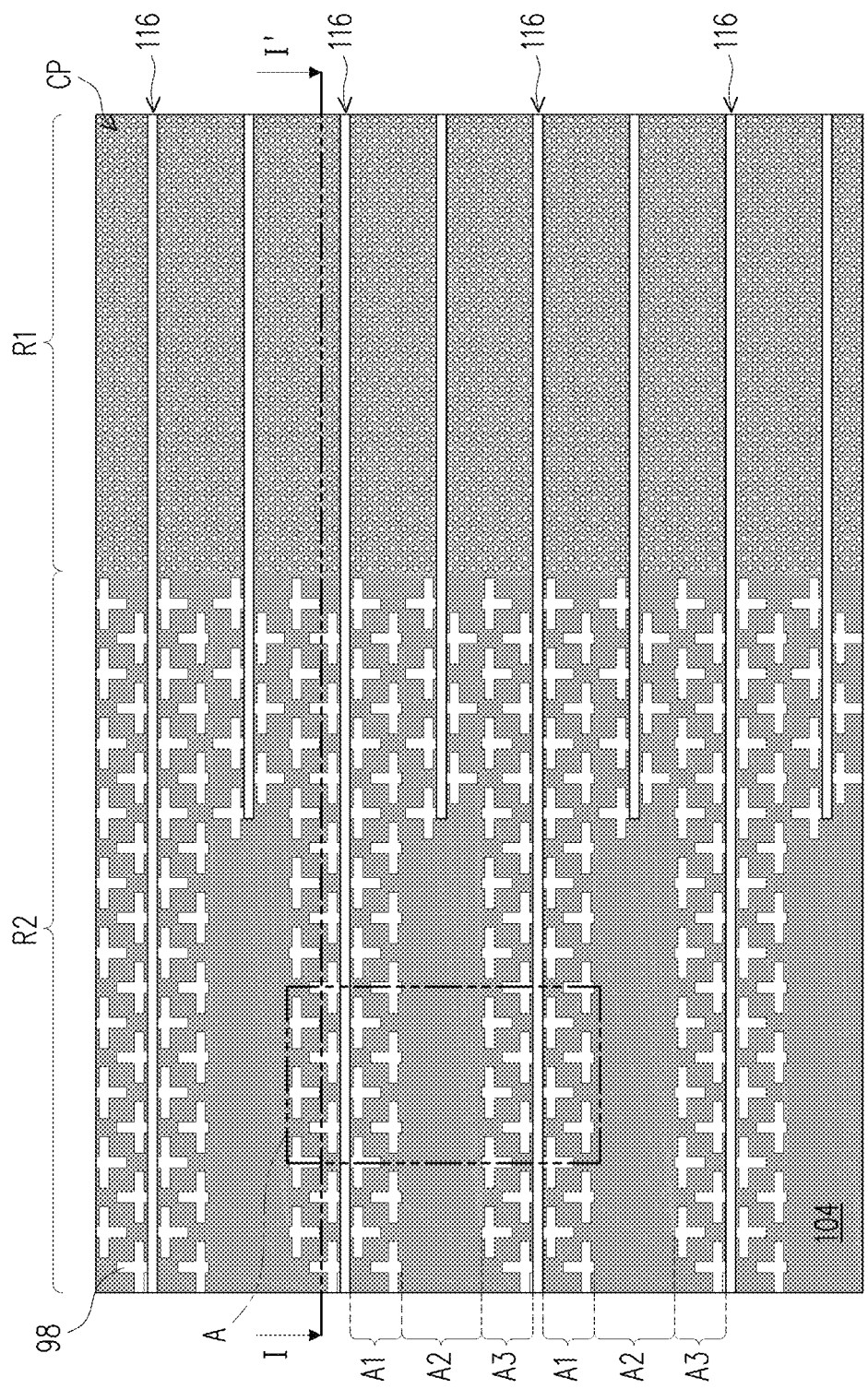

FIG. 3E is a top view of a three-dimensional memory device. FIG. 3A is a schematic cross-sectional view taken along line I-I' of FIG. 3E. FIG. 3B is an enlarged view of a zone A in FIG. 3E. FIG. 3C is a schematic cross-sectional view taken along line II-II' of FIG. 3B. FIG. 3D is a schematic cross-sectional view taken along line III-III' of FIG. 3B. For clarity, the material layers above the uppermost sacrificial layer 104 are omitted in FIG. 3B and FIG. 3E.

Referring to FIG. 3B to FIG. 3E, next, a trench 116 is formed in the stack structure 101 and part of the stack structure 91 in the memory array region R1, and between the first zone A1 and the third zone A3 of the staircase region R2 as shown in FIGS. 3B and 3E. The trench 116 exposes the sacrificial layers 104, the insulating layers 102, the insulating layers 92, and the conductive layers 94 as shown in FIGS. 3C and 3D.

Figure 4A:
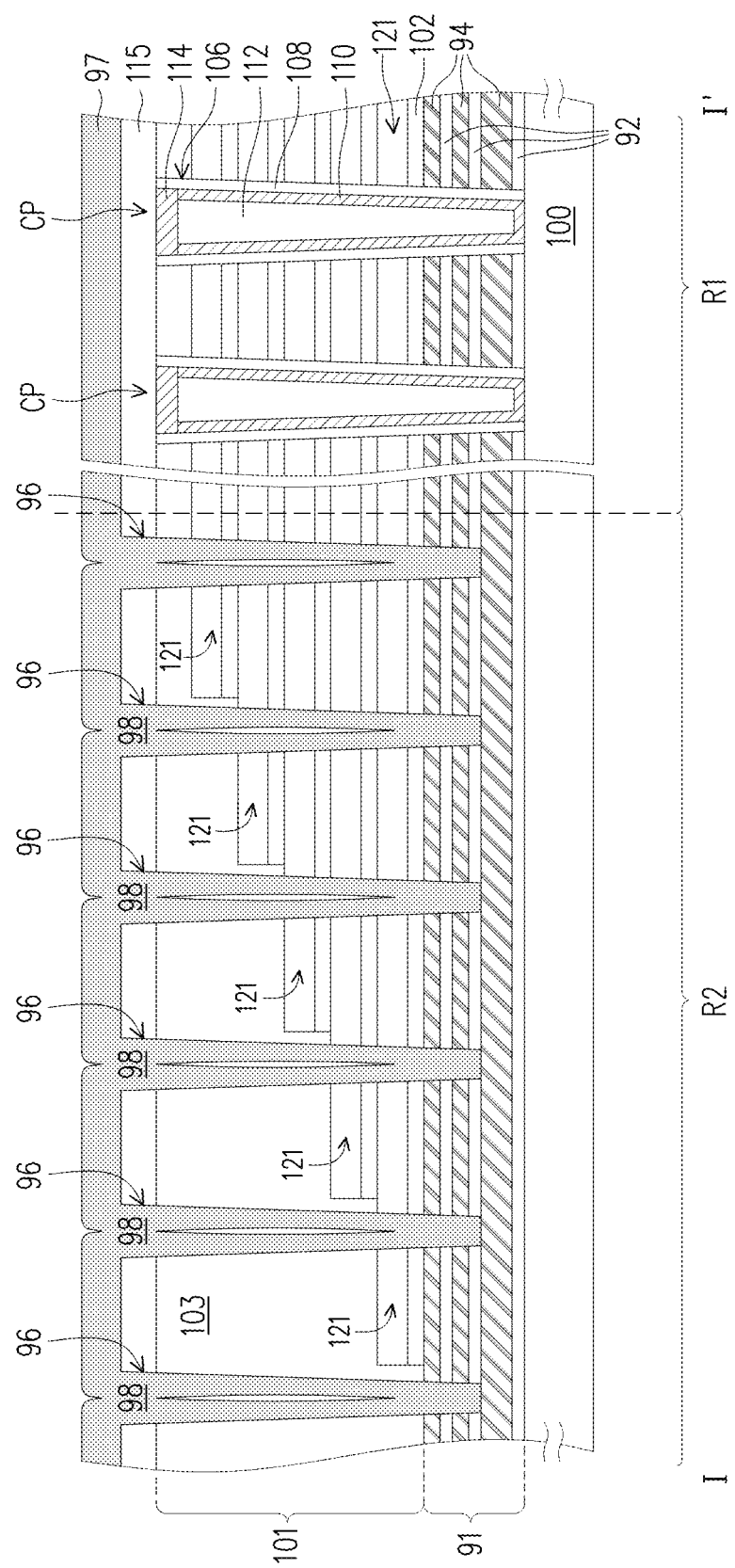
Figure 4B:
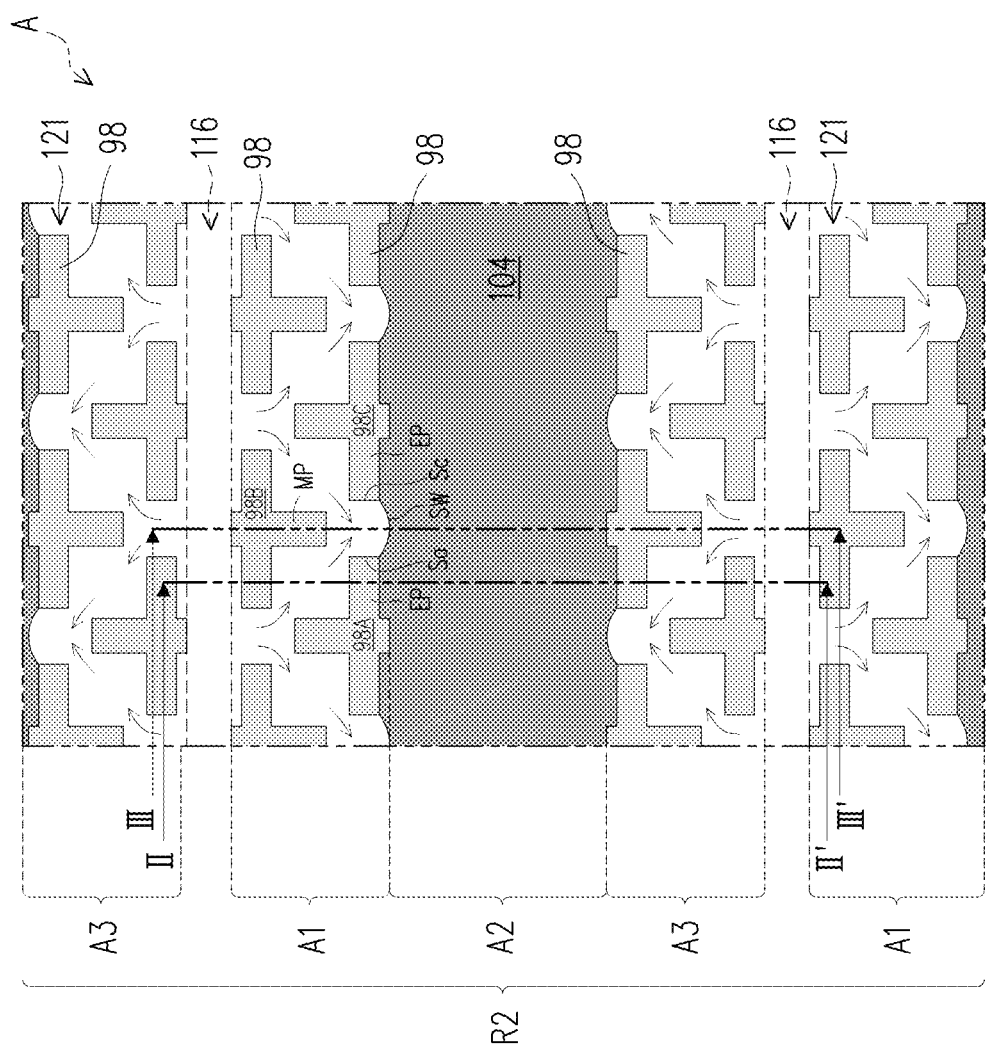
Figure 4C:
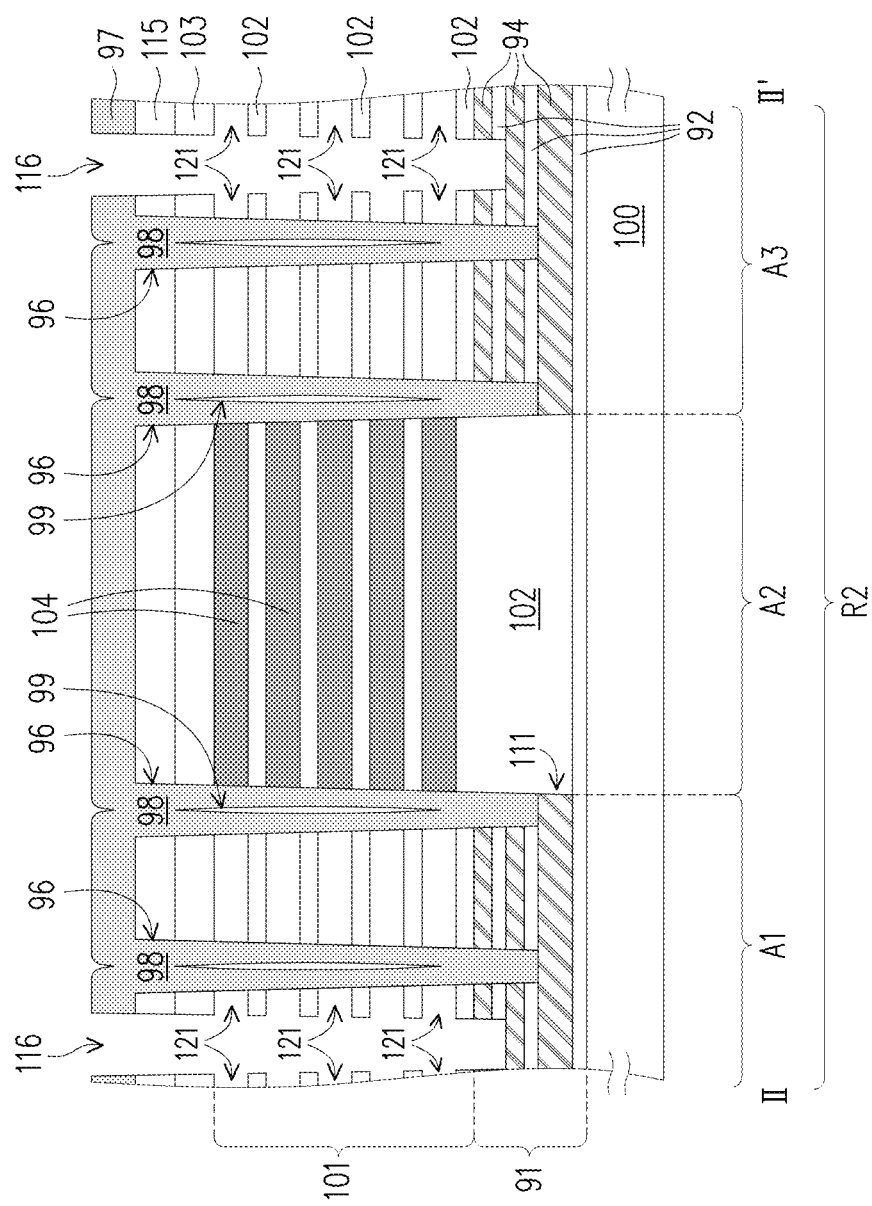
Figure 4D:
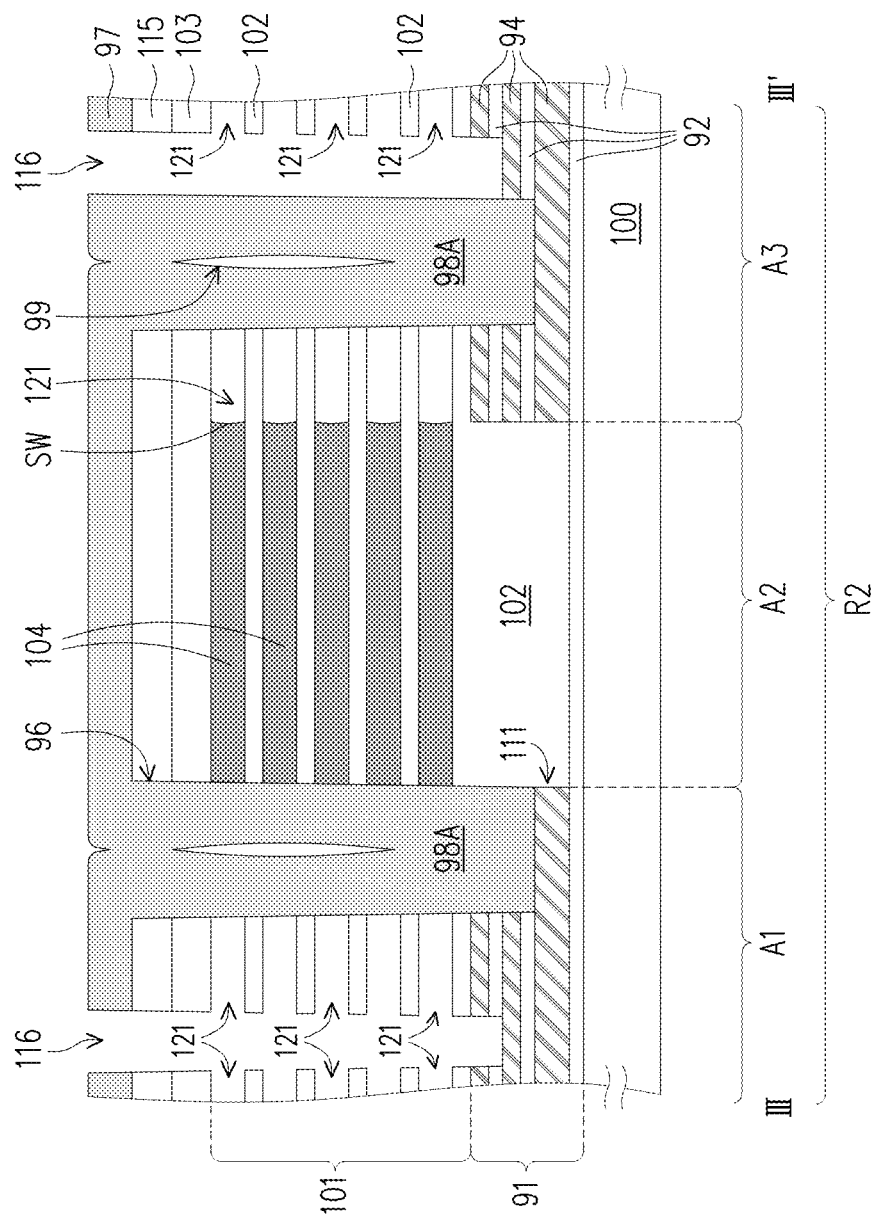

FIG. 4A is a schematic cross-sectional view of a subsequent process taken along line I-I' of FIG. 3E. FIG. 4B is an enlarged view of a zone A in FIG. 3E in the subsequent process. FIG. 4C is a schematic cross-sectional view taken along line II-II' of FIG. 4B. FIG. 4D is a schematic cross-sectional view taken along line III-III' of FIG. 4B. For clarity, the material layers above the uppermost sacrificial layer 104 and an uppermost horizontal opening 121 are omitted in FIG. 4B and FIG. 4E.

Referring to FIG. 4A to FIG. 4E, next, a selective etching process is performed to remove the sacrificial layers 104 in the memory array region R1 and the first zone A1 and the third zone A3 of the staircase region R2 to form a plurality of horizontal openings 121. The horizontal openings 121 expose part of the charge storage structure 108 and the insulating layers 102 in the memory array region R1, as shown in FIG. 4A. The horizontal openings 121 also expose the supporting pillars 98 and the insulating layers 102 in the first zone A1 and the third zone A3 of the staircase region R2, as shown in FIGS. 4A to 4D. The selective etching process may be isotropic etching such as a wet etching process. The etchant used in the wet etching process is, for example, hot phosphoric acid. The etchant flows into the memory array region R1, and the first zone A1 and the third zone A3 of the staircase region R2 through the trench 116.

Figure 4E:
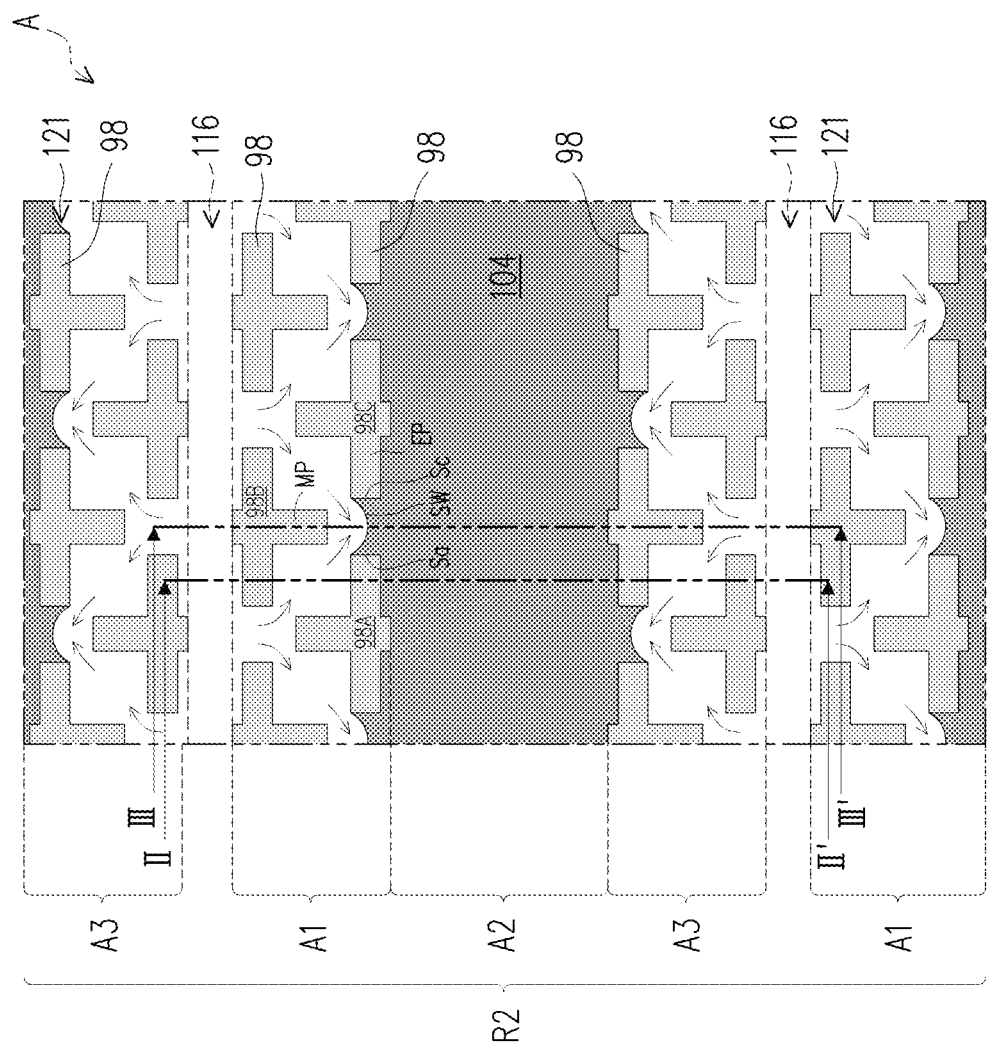

Referring to FIGS. 4B and 4E, in the staircase region R2, the etchant may completely remove the sacrificial layers 104 in the first zone A1 and the third zone A3 through time mode control. The sacrificial layers 104 located in the second zone A2 are only slightly etched due to the structure and the layout design of the supporting pillars 98. For example, at the boundary between the first zone A1 and the second zone A2, the sidewall of the sacrificial layer 104 is mostly covered by the supporting pillars 98, and only a small part of the sacrificial layer 104 continuously extends from the first zone A1 to the second zone A2. At the boundary between the third zone A3 and the second zone A2, the sidewall of the sacrificial layer 104 is mostly covered by the supporting pillars 98, and only a small part of the sacrificial layer 104 continuously extends from the third zone A3 to the second zone A2.

Figure 6A:
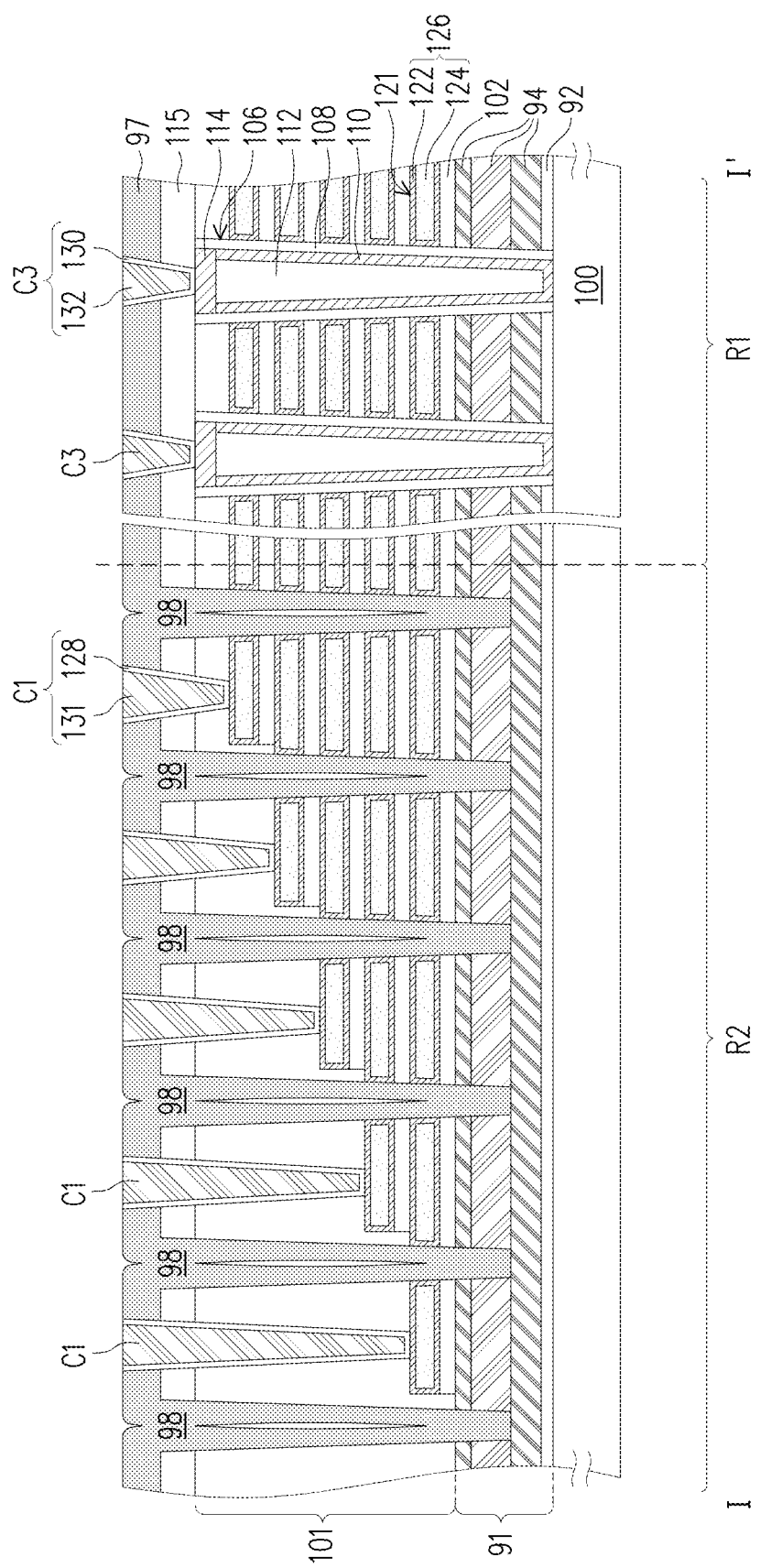
Figure 6B:
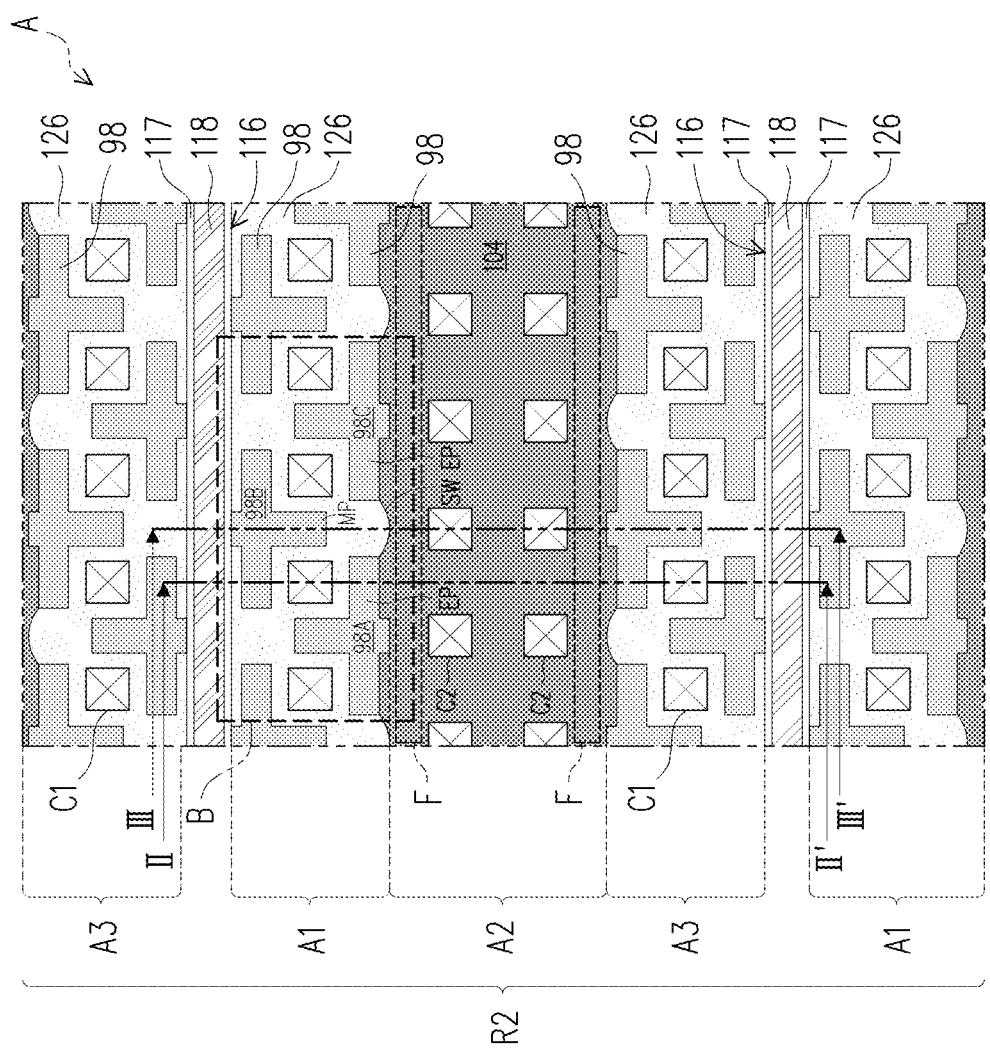
Figure 6C:
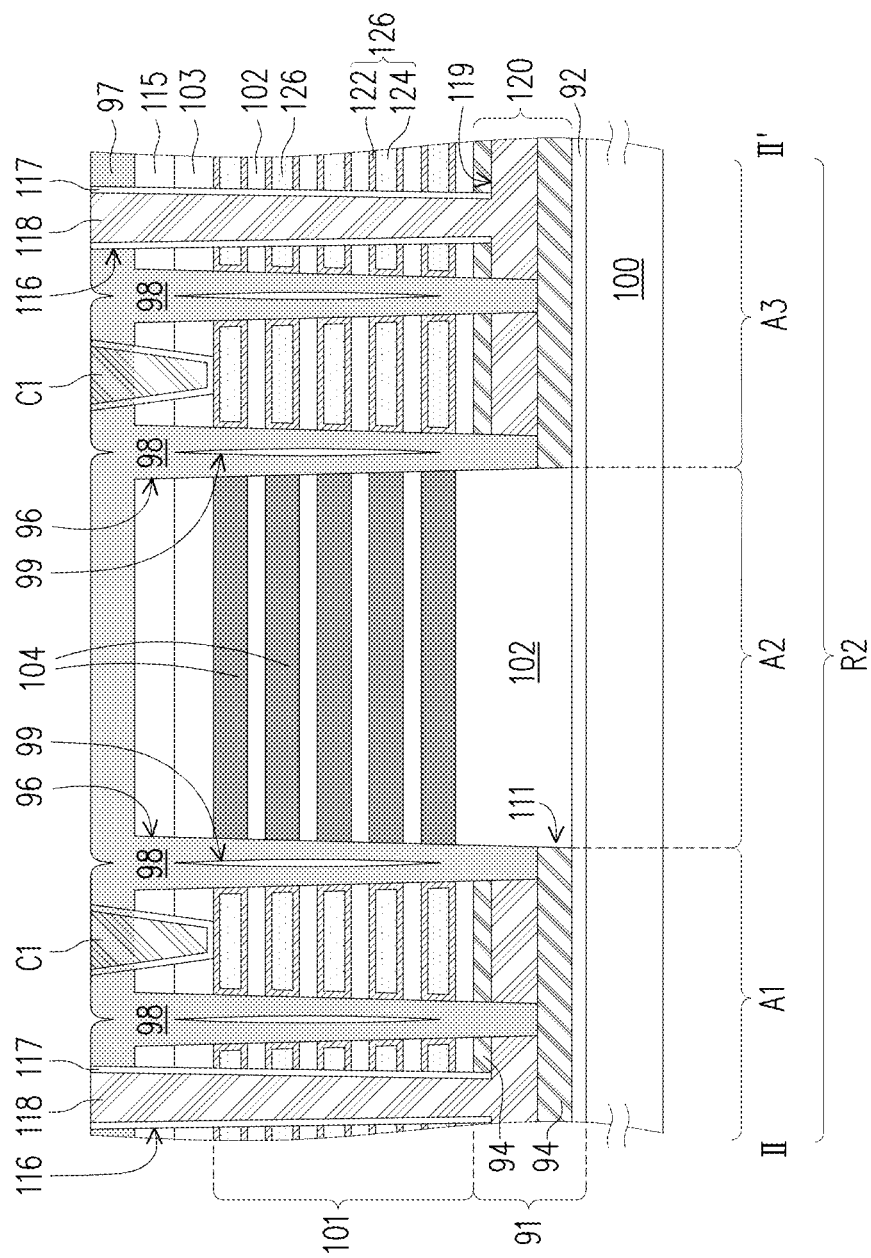
Figure 6D:
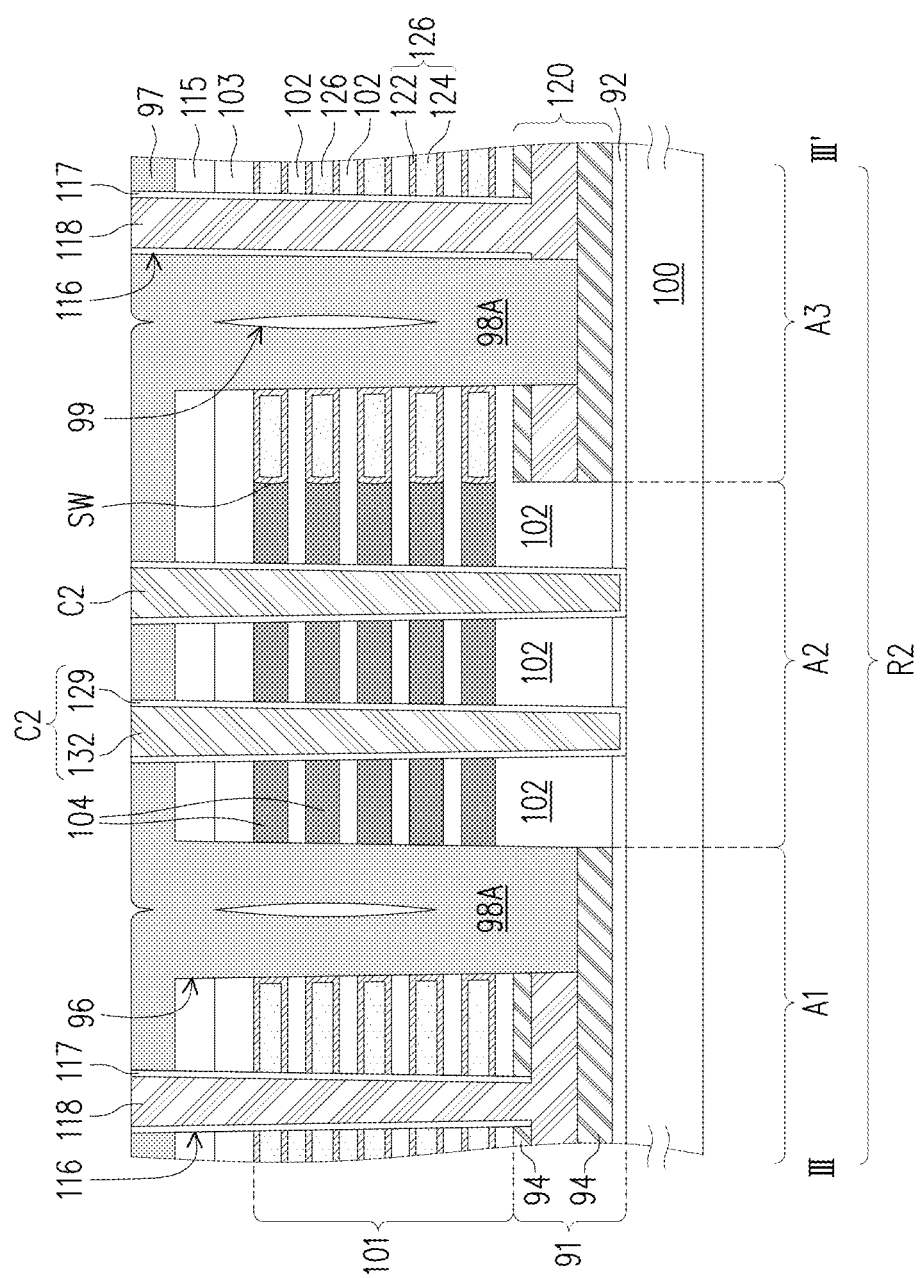
Figure 6E:
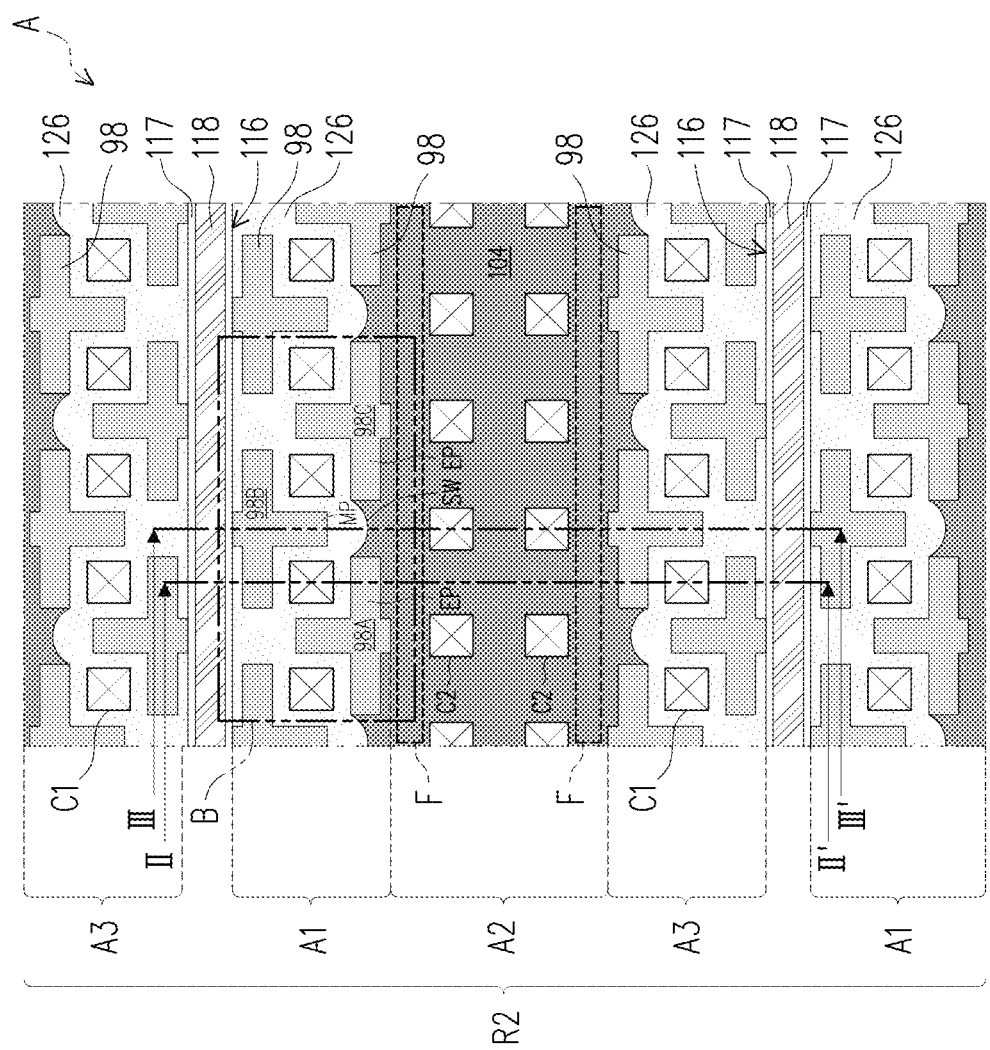
Figure 6F:
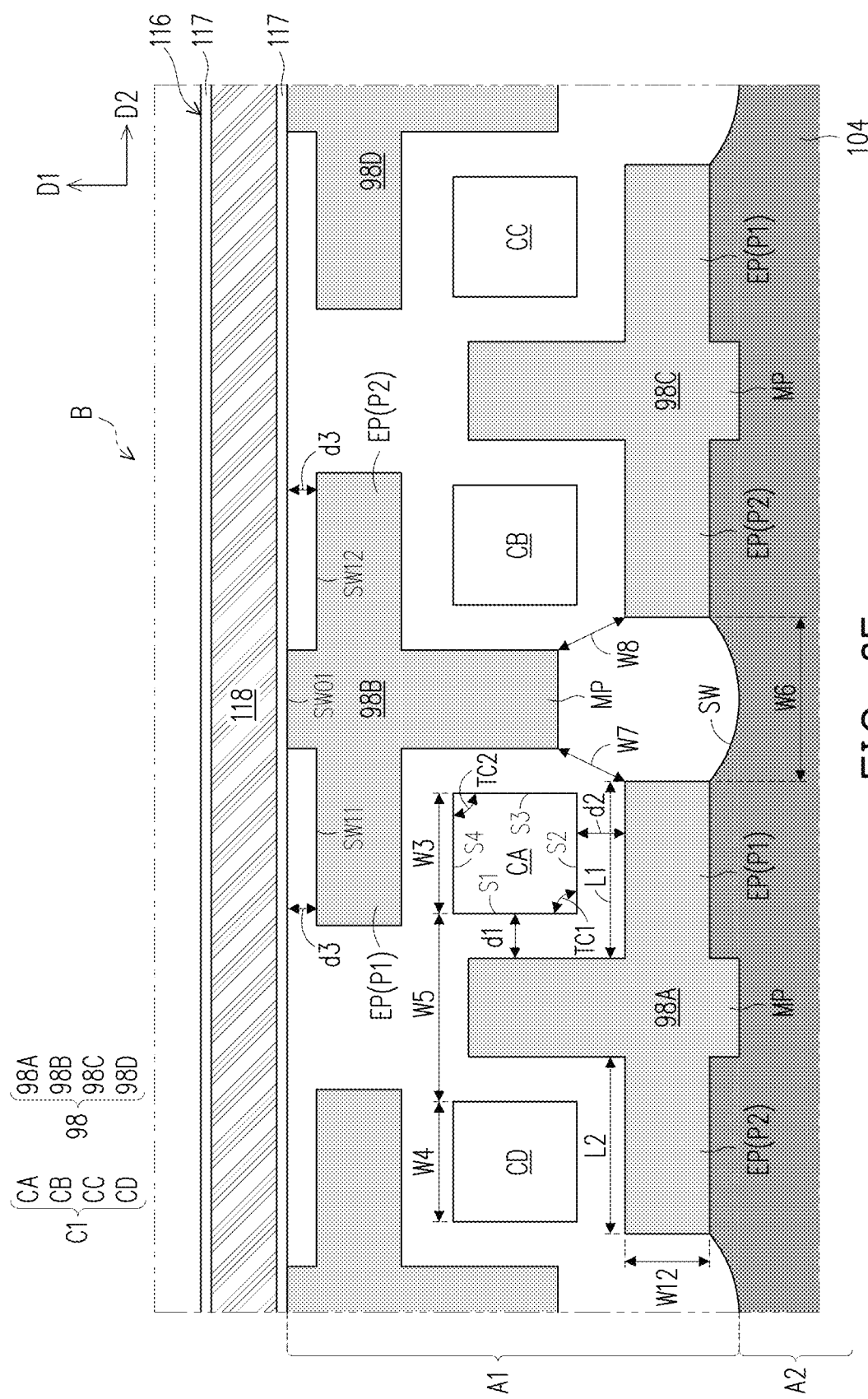
FIG. 6F is a partial enlarged view of an area B in FIG. 6B.

Referring to FIGS. 4B and 4E, and 6F, a width W7 of a gap between the supporting pillar 98B and the supporting pillar 98A, a width W8 of a gap between the supporting pillar 98B and the supporting pillar 98C, and a width W6 of a gap between the supporting pillar 98A and the supporting pillar 98C are all small as shown in FIG. 6F. Therefore, when the etchant removes the sacrificial layer 104 between a supporting pillar 98B and a supporting pillar 98A, and between the supporting pillar 98B and a supporting pillar 98C, only an appropriate amount of etchant may flow through these gaps. As a result, through the etching time, it is possible to control not to etch, or etch only a small part of, the sacrificial layer 104 of the second zone A2. In this embodiment, the etching amount of the sacrificial layer 104 in the second zone A2 may be effectively controlled by the supporting pillars 98. Therefore, it is not required to form a continuous and uninterrupted insulating slit between the boundary of the first zone A1 and the second zone A2, and the boundary of the third zone A3 and the second zone A2 to prevent the sacrificial layer 104 of the second zone A2 from being etched. Accordingly, the disclosure may reduce the complexity of the manufacturing process.

Referring to FIGS. 4B, 4D, and 4E, in addition, due to the isotropy of the etching, the sacrificial layer 104 at the boundary between the first zone A1 and the second zone A2, and at the boundary between the third zone A3 and the second zone A2 has an uneven profile. For example, the sacrificial layer 104 in the second zone A2 has an arc-shaped sidewall SW. By controlling the etching time, the position of the sidewall SW of the sacrificial layer 104 may be different. When the etching time is longer, more sacrificial layer 104 is etched, the sidewall SW of the remaining sacrificial layer 104 in the second zone A2 is farther away from the body portion MP of the supporting pillar 98B, and the sidewalls Sa and Sc of the extension portions EP of the supporting pillars 98A and 98C at the boundary between the first zone A1 and the second zone A2 are exposed, as shown in FIG. 4B. When the etching time is shorter, less sacrificial layer 104 is etched, the sidewall SW of the remaining sacrificial layer 104 is closer to the body portion MP of the supporting pillar 98B, and the sidewalls of the extension portions EP of the supporting pillars 98A and 98C at the boundary between the first zone A1 and the second zone A2 are still covered by the remaining sacrificial layer 104, as shown in FIG. 4E.

Figure 5A:
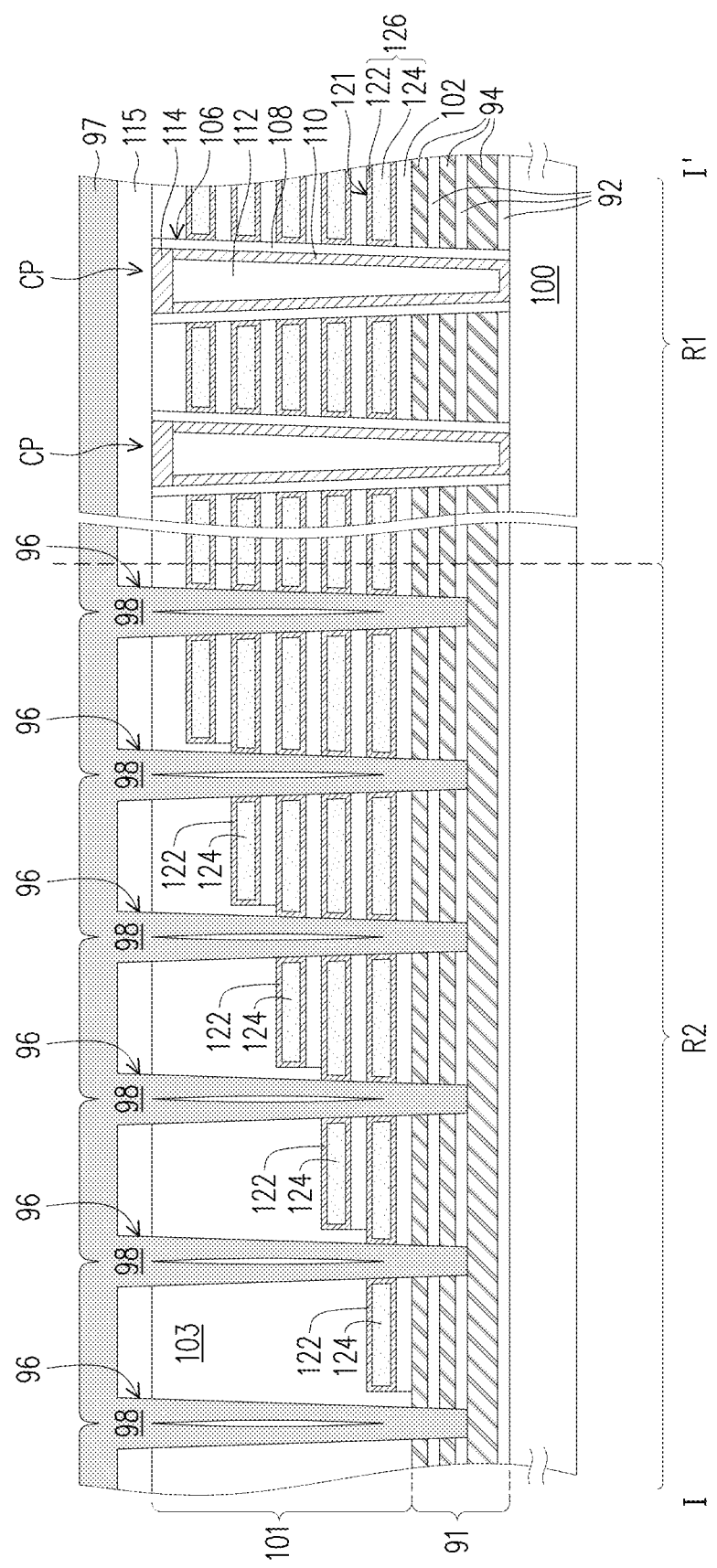
Figure 5B:
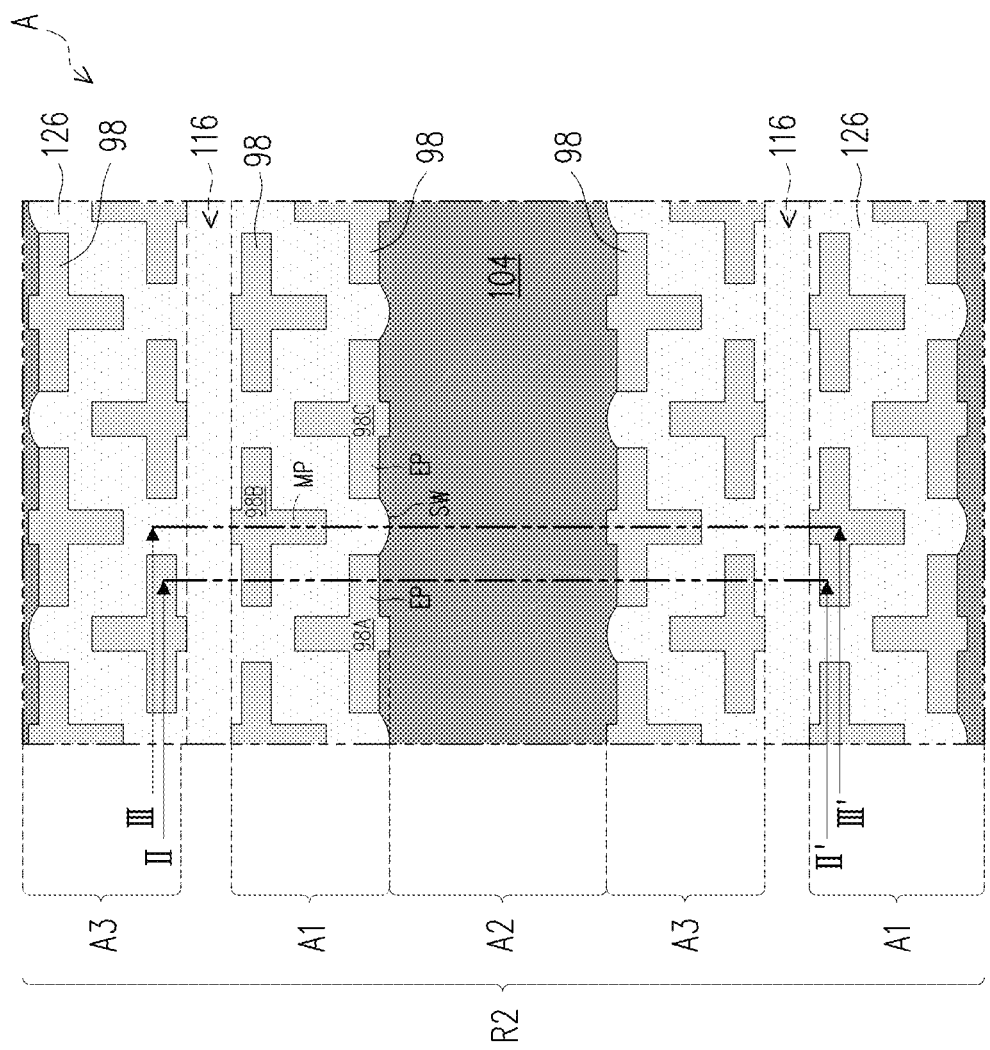
Figure 5C:
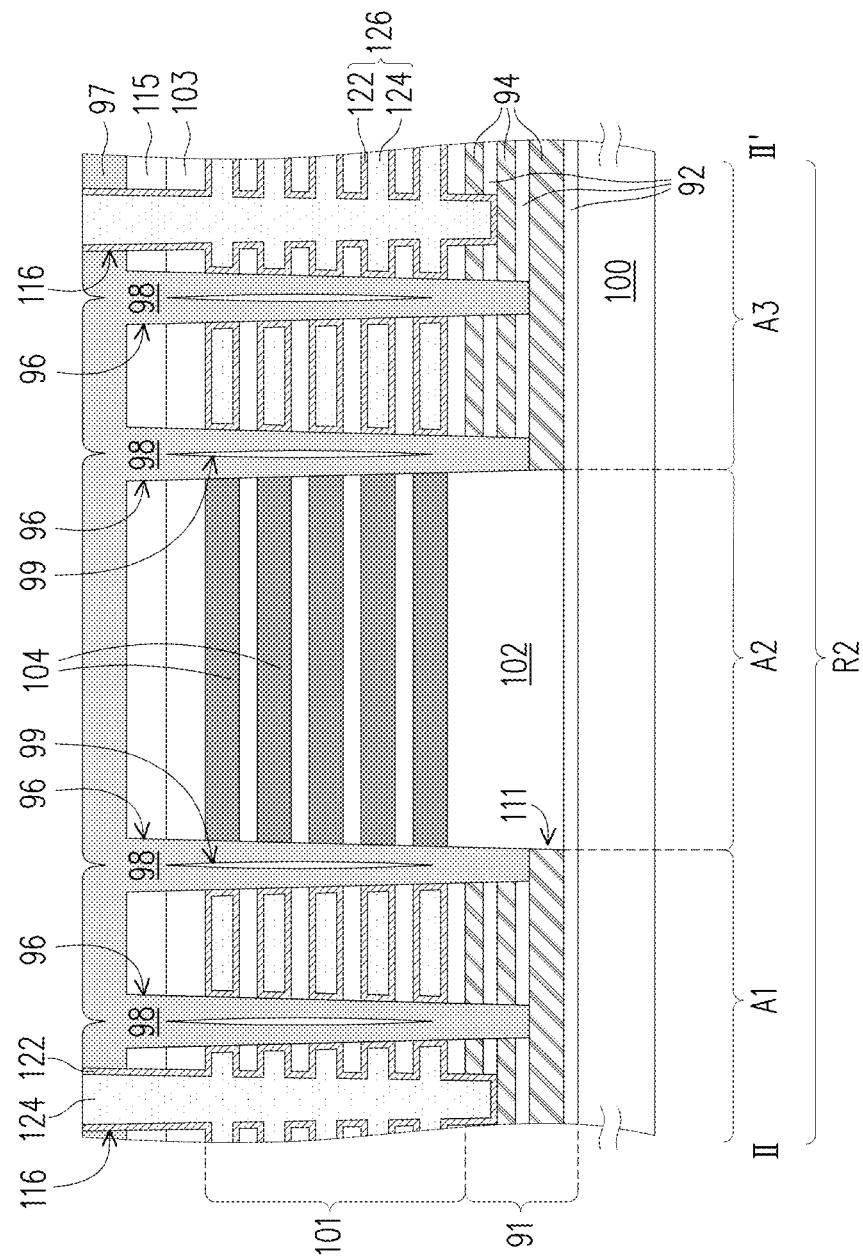
Figure 5D:
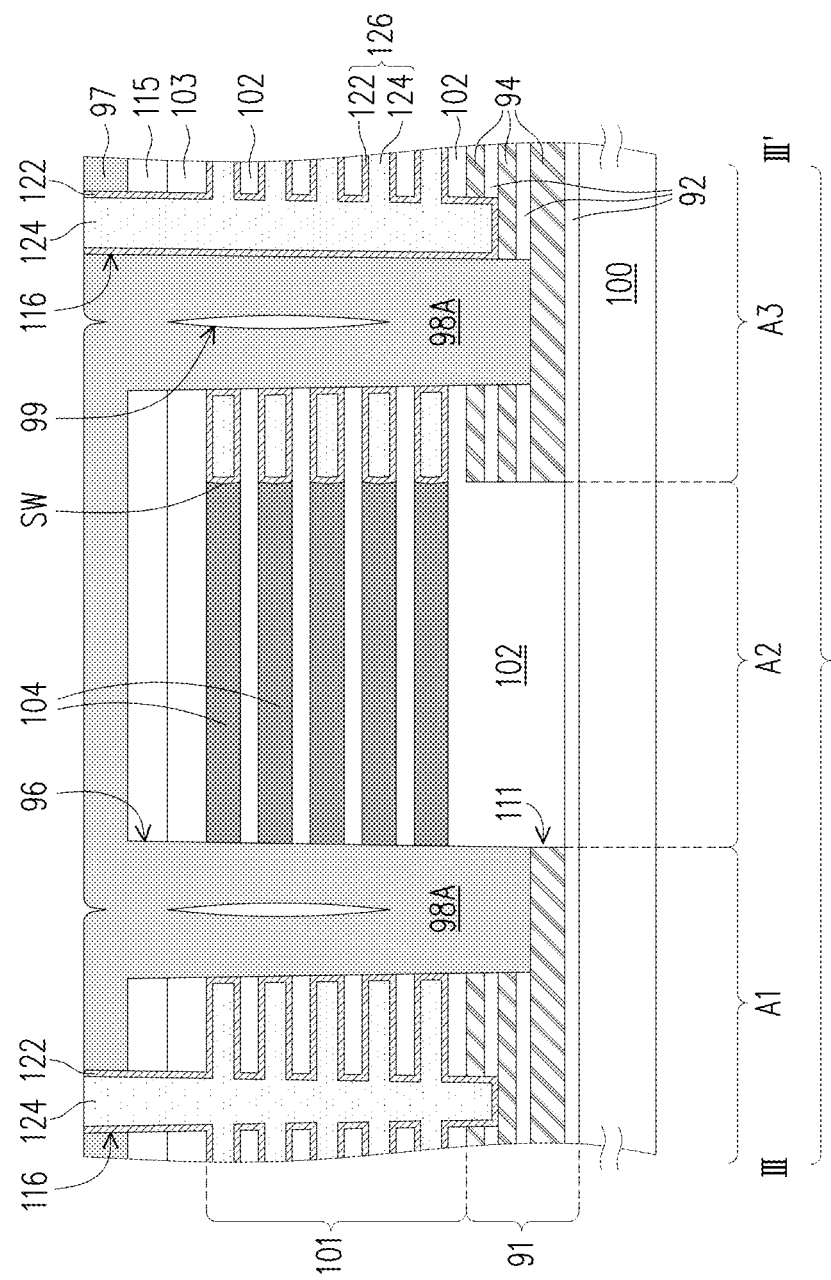
Figure 5E:
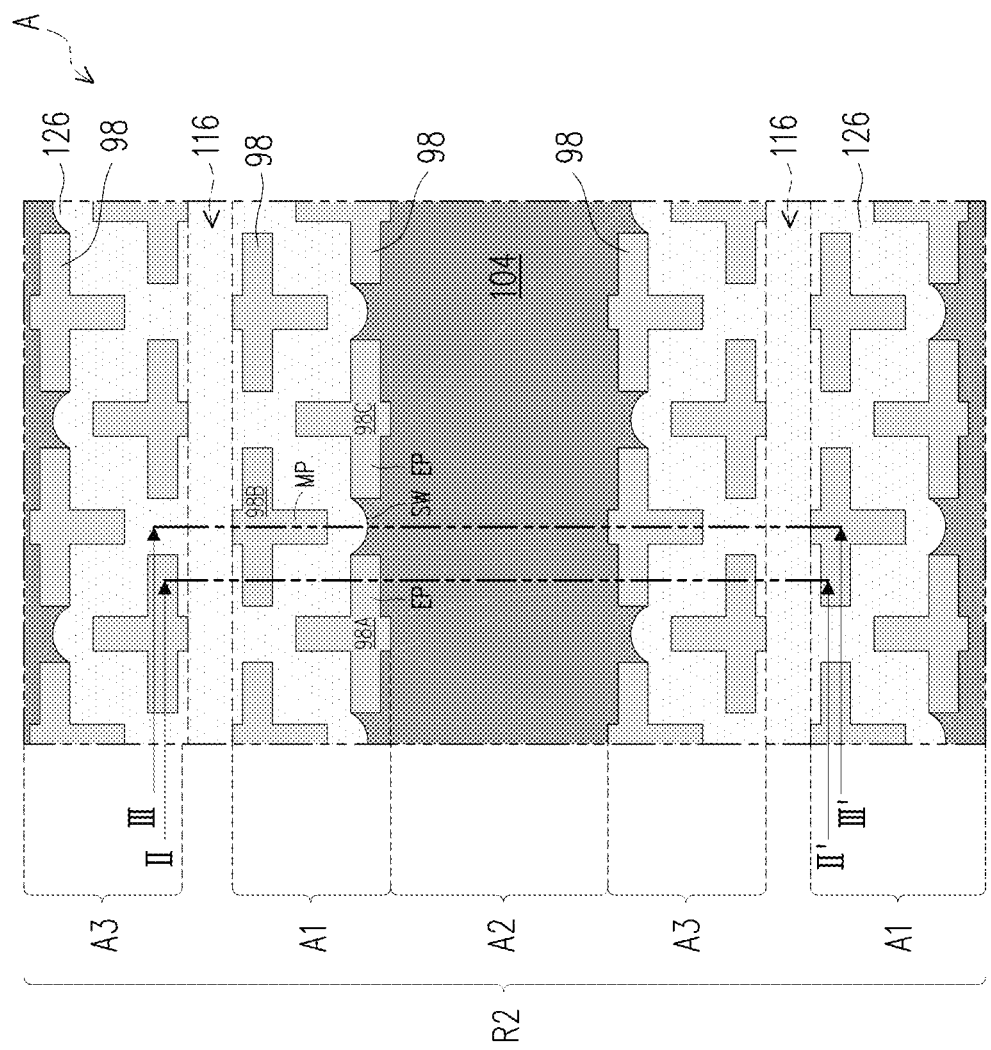

FIG. 5A is a schematic cross-sectional view of a subsequent process taken along line I-I' of FIG. 3E. FIG. 5B is an enlarged view of a zone A in FIG. 3E in the subsequent process. FIG. 5C is a schematic cross-sectional view taken along line II-II' of FIG. 5B. FIG. 5D is a schematic cross-sectional view taken along line III-III' of FIG. 5B. For clarity, the material layers above the uppermost sacrificial layer 104 and an uppermost gate layer 126 are omitted in FIG. 5B and FIG. 5E.

Referring to FIG. 5A to FIG. 5E, next, a conductive layer is formed in the trench 116 and the horizontal opening 121. The conductive layer includes, for example, a barrier layer 122 and a metal layer 124, as shown in FIGS. 5A, 5C, and 5D. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W). The conductive layer in the horizontal opening 121 serves as the gate layer 126.

FIG. 6A is a schematic cross-sectional view of a subsequent process taken along line I-I' of FIG. 3E. FIG. 6B is an enlarged view of a zone A in FIG. 3E in the subsequent process. FIG. 6C is a schematic cross-sectional view taken along line II-II' of FIG. 6B. FIG. 6D is a schematic cross-sectional view taken along line III-III' of FIG. 6B. For clarity, the material layers above the uppermost sacrificial layer 104 and the uppermost gate layer 126 are omitted in FIG. 6B and FIG. 6E.

Referring to FIG. 6A to FIG. 6E, next, a plurality of contacts C1 are formed in the first zone A1 and the third zone A3 of the staircase region R2 (as shown in FIGS. 6A to 6C), a plurality of contacts C2 are formed in the second zone A2 of the staircase region R2 (as shown in FIGS. 6B to 6D), and a plurality of contacts C3 are formed in the memory array region R1 (as shown in FIG. 6A). The contacts C1 penetrate the insulating layer 97, the insulating cap layer 115 and the dielectric layer 103, and are electrically connected to the gate layer 126, as shown in FIGS. 6A to 6C. The contacts C2 penetrate the insulating cap layer 115 and the dielectric layer 103, and the insulating layers 102 and the sacrificial layers 104 of the stack structure 101, and are electrically connected to the substrate 100, as shown in FIGS. 6B to 6D. "Being electrically connected to the substrate 100" as described herein may refer to being electrically connected to the substrate 100, being electrically connected to the device layer on the substrate 100, or being electrically connected to the metal interconnect structure. The contacts C3 penetrate the insulating layer 97 and the insulating cap layer 115 of the stack structure 101, and are electrically connected to the conductive plug 114, as shown in FIG. 6A. The contacts C1, C2 and C3 may be formed simultaneously or separately.

In an embodiment, each of the contacts C1 includes a barrier layer 128 and a conductive layer 131 (as shown in FIGS. 6A and 6C), each of the contacts C2 includes a barrier layer 129 and a conductive layer 132 (as shown in FIG. 6D), and each of the contacts C3 includes a barrier layer 130 and a conductive layer 133 (as shown in FIG. 6A). In an embodiment, the material of the barrier layers 128, 129, and 130 includes titanium (Ti), titanium nitride (TiN), tantalum (Ta), tantalum nitride (TaN), or a combination thereof, and the material of the conductive layers 131, 132, and 133 includes tungsten (W).

Referring to FIG. 6B to FIG. 6E, afterwards, the barrier layer 122 and the metal layer 124 (shown in FIGS. 5B to 5D) in the trench 116 are removed. Next, a spacer 117 is formed on the sidewall of the trench 116. The spacer 117 includes a dielectric material different from the insulating layer 102, such as silicon nitride or a silicon oxide/silicon nitride/silicon oxide composite layer. Then, the middle conductive layer 94 in the stack structure 91 is removed. Also, the insulating layers 92 above and below the middle conductive layer 94 are removed to form a horizontal opening 119 in the stack structure 91. Next, a conductive layer is filled in the trench 116 and the horizontal opening 119. The conductive layer in the horizontal opening 119 and the conductive layers 94 above and below it collectively form a source line 120. The conductive layer in the trench 116 forms a source line slit 118 for conducting the current from the source line 120. The spacer 117 isolates the source line slit 118 from contacting with the gate layer 126.

Afterwards, subsequent manufacturing processes are performed to complete the fabrication of the memory device.

Referring to FIG. 2A and FIG. 4A, before removing the sacrificial layers 104 of the stack structure 101, in the disclosure, the supporting pillars 98 which penetrate the stack structure 101 and extend to the stack structure 91 are first formed in the staircase region R2 of the substrate 100. The formation of the supporting pillars 98 may prevent the stack structure 101 from collapsing after the sacrificial layers 104 are removed.

A plurality of supporting pillars 98 are shown in FIG. 6F. The supporting pillars 98 are disposed around the plurality of contacts C1. In some embodiments, the top surface area of the supporting pillar 98 is greater than or equal to the top surface area of the contact C1. The area of the top surface of the supporting pillar 98 is, for example, 1 to 5 times the area of the top surface of the contact C1.

Referring to FIG. 6F, the supporting pillars 98 include supporting pillars 98A, 98B, 98C and 98D. The contacts C1 include contacts CA, CB, CC, and CD arranged in a row. The supporting pillars 98A and 98C are arranged in one row, and the supporting pillars 98B and 98D are arranged in another row. The supporting pillars 98A, 98B, 98C, and 98D are arranged in a zigzag pattern with respect to each other. The supporting pillars 98A and 98B surround the contact CA, the supporting pillars 98B and 98C surround the contact CB, and the supporting pillars 98C and 98D surround the contact CC.

Referring to FIG. 6F, the body portion MP of the supporting pillar 98A is disposed around a first side S1 of the contact CA at a distance d1. The first portion P1 of the extension portions EP is disposed around a second side S2 of the contact CA at a distance d2. The distance d1 and the distance d2 may be the same or different. The distance d1 and the distance d2 are, for example, 100 nm to 400 nm. In some embodiments, the contact CA is in a circle shape. In alternative embodiments, the contact CA is in a substantially rectangular shape or the like, and the supporting pillar 98A is disposed around two sides S1 and S2 of the contact CA and a corner TC1 therebetween.

Referring to FIG. 6F, a length L1 of the first portion P1 of the extension portions EP is greater than a width W3 of the contact CA, and is less than a sum of the width W3 of the contact CA and a width W5 of a gap between the two adjacent contacts CA and CB. A length L2 of the second portion P2 of the extension portions EP is greater than a width W4 of the contact CD, and is less than a sum of the width W4 of the contact CD and the distance between the contact CD and another adjacent contact (not shown).

Referring to FIG. 6F, the structures of the supporting pillars 98B, 98C, and 98D may be the same as or different from the structure of the supporting pillar 98A. The body portion MP of the supporting pillar 98B is disposed around a third side S3 of the contact CA. The first portion P1 of the extension portions EP of the supporting pillar 98B is disposed around a fourth side S4 of the contact CA. In some embodiments, the contact CA is in a substantially rectangular shape, and the supporting pillar 98B is disposed around two sides S3 and S4 of the contact CA and a corner TC2 therebetween. In other words, the supporting pillar 98B and the supporting pillar 98A are disposed at the two opposite corners TC1 and TC2 of the contact CA and together surround the contact CA. The body portion MP of the supporting pillar 98B is disposed corresponding to the body portion MP of the supporting pillar 98A, and the first portion P1 of extension portions EP of the supporting pillar 98B is disposed corresponding to the first portion P1 of the extension portions EP of the supporting pillar 98A.

Referring to FIG. 6F, the extension portions EP of the supporting pillar 98A are adjacent to the extension portions EP of the supporting pillar 98C, and the two may be flush or slightly staggered. The extension portions EP of the supporting pillars 98B and 98D may be flush or slightly misaligned. A width W6 of the gap between the extension portions of the supporting pillars 98A and 98C is less than the width W5 of the gap between the two contacts CA and CB. The width W6 is, for example, 100 nm to 500 nm.

Referring to FIG. 6F, the sidewall SW01 of the body portion MP of the supporting pillar 98B may be in contact with the spacer 117. A distance d3 between the sidewall SW11 of the first portion P1 and the sidewall SW12 of the second portion P2 of the extension portions EP of the supporting pillar 98B and the spacer 117 is, for example, 0 nm to 200 nm. The body portion MP of the supporting pillar 98B is located between the body portion MP of the supporting pillar 98A and the body portion MP of the supporting pillar 98C, and is located between the contact CA and the contact CB. The body portion MP of the supporting pillar 98B is adjacent to the first portion P1 of the extension portions EP of the supporting pillar 98A and the second portion P2 of the extension portions EP of the supporting pillar 98C. A width W7 of the gap between the body portion MP of the supporting pillar 98B and the extension portions EP of the supporting pillar 98A, and a width W8 of the gap between the body portion MP of the supporting pillar 98B and the extension portions EP of the supporting pillar 98C restrict the flow of the etchant. The width W7 and the width W8 may be the same or different. The width W7 and the width W8 are, for example, 50 nm to 500 nm.

Referring to FIGS. 6C and 6D, the stack structure 91 in the first zone A1, and the third zone A3 of the staircase region R2 is composed of the insulating layer 92 and the conductive layer 94. The stack structure 101 in the first zone A1 and the third zone A3 is different from the stack structure 101 in the second zone A2. In the first zone A1 and the third zone A3, the stack structure 101 is composed of the insulating layers 102 and the conductive layers, which serve as the gate layers 126, stacked alternately on each other. The stack structure 101 in the second zone A2 is composed of the insulating layers 102 and the sacrificial layers 104.

As shown in FIG. 6B and FIG. 6C, in the first zone A1 and the third zone A3, each of the contacts C1 passes through the dielectric layer 103, and lands on one gate layer 126 in the stack structure 101 and is electrically connected thereto. As shown in FIG. 6B and FIG. 6D, each of the contacts C2 in the second zone A2 penetrates the stack structure 101 and is electrically connected to the substrate 100.

The contacts C1 and the contacts C2 are separated by the supporting pillars 98, and a strip-shaped insulating slit which penetrates the stack structures 101 and 91 is not provided between the contacts C1 and the contacts C2 as shown in FIGS. 6B and 6E.

Referring to FIGS. 6B, 6C and 6E The supporting pillars 98 at the boundary between the first zone A1 and the second zone A2 penetrate the stack structure 101 and part of the stack structure 91 in the first zone A1 and the stack structure 101 in the second zone A2; the supporting pillars 98 at the boundary between the third zone A3 and the second zone A2 penetrate the stack structure 101 and part of the stack structure 91 in the third zone A3 and the stack structure 101 in the second zone A2.

Referring to FIGS. 6B, 6E and 6F, the supporting pillars 98 at the boundary between the first zone A1 and the second zone A2 and the boundary between the third zone A3 and the second zone A2 are separated from each other by a non-zero distance (e.g., the width W6), as shown in FIG. 6F. A strip-shaped insulating slit which penetrates the stack structures 101 and 91 is not provided regions F between the supporting pillars 98 and the contacts C2 to separate them from each other, as shown in FIGS. 6B and 6E. Therefore, at the boundary between the first zone A1 and the second zone A2 and at the boundary between the third zone A3 and the second zone A2, between two adjacent supporting pillars 98, the insulating layers 102 of the stack structure 101 of the second zone A2 continuously extend to the first zone A1 and the third zone A3 (as shown in FIG. 6B), and the sacrificial layers 104 are in contact with the gate layers (conductive layers) 126 of the first zone A1 and the third zone A3 (as shown in FIGS. 6B, 6D, and 6E).

Referring to FIG. 6B, FIG. 6D, and FIG. 6F, the sacrificial layers 104 in the second zone A2 have an uneven sidewall SW, e.g., an arc-shaped sidewall. In some embodiments, the sidewall SW of the sacrificial layers 104 is recessed toward the contact C2. This is caused by the wet etching process performed when removing the sacrificial layers 104 in the memory array region R1 and the first zone A1 and the third zone A3 of the staircase region R2 to form the horizontal openings 121, as shown in FIG. 4D.

To prevent the stack structure 101 from collapsing in the process of removing the sacrificial layers to form the horizontal openings 121, a large number of supporting pillars 98 are formed in the staircase region R2, as shown in FIGS. 6B and 6E. In some embodiments, the total top surface area of the supporting pillars 98 in the staircase region R2 is greater than or equal to the total top surface area of the contacts C1.

In this embodiment, the structure and the layout design of the supporting pillars may effectively control the etching amount of the sacrificial layers. Therefore, it is no longer required to form a strip-shaped insulating slit to prevent the sacrificial layers from being over-etched. Accordingly, the disclosure may simplify the manufacturing process and reduce the complexity of the manufacturing process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device comprising:
   a substrate;
   a stack structure located on the substrate, wherein the stack structure comprises a plurality of conductive layers and a plurality of insulating layers stacked alternately on each other;
   a first contact connected to one of the plurality of conductive layers of the stack structure; and
   a first supporting pillar penetrating the stack structure and disposed adjacent to a first side and a second side of the first contact, the first supporting pillar comprising:
      a first body portion disposed adjacent to the first side of the first contact; and
      a plurality of first extension portions located on two sides of the first body portion, wherein a length of each of the first extension portions is greater than a width of the first contact, and a first portion of the plurality of first extension portions is disposed adjacent to the second side of the first contact,
   wherein the stack structure further comprises a plurality of sacrificial layers, the plurality of sacrificial layers and the plurality of insulating layers stacked alternately on each other, and the first supporting pillar is disposed to separate the plurality of sacrificial layers from the plurality of conductive layers.

2. The memory device according to claim 1, further comprising:
a second supporting pillar penetrating the stack structure and disposed adjacent to a third side and a fourth side of the first contact, wherein the second supporting pillar and the first supporting pillar together surround the first contact.

3. The memory device according to claim 2, wherein the first supporting pillar is disposed adjacent to a first corner of the first contact and the first side and the second side connected to the first corner, and the second supporting pillar is disposed adjacent to a second corner of the first contact and the third side and the fourth side connected to the second corner.

4. The memory device according to claim 2, further comprising:
a second contact connected to another one of the plurality of conductive layers of the stack structure; and
a third supporting pillar penetrating the stack structure, wherein the second supporting pillar is located between the first supporting pillar and the third supporting pillar, and the second supporting pillar and the third supporting pillar together surround the second contact.

5. The memory device according to claim 4, wherein a length of the first portion of the first extension portions is less than a sum of the width of the first contact and a width of a gap between the first contact and the second contact.

6. The memory device according to claim 4, wherein the second supporting pillar comprises a second body portion located between the first body portion of the first supporting pillar and a third body portion of the third supporting pillar.

7. The memory device according to claim 4, wherein the second body portion of the second supporting pillar is located between the first contact and the second contact.

8. The memory device according to claim 4, wherein a third extension portion of the third supporting pillar is adjacent to the first portion of the plurality of first extension portions.

9. The memory device according to claim 2, wherein shapes of the first supporting pillar and the second supporting pillar comprise a cross-shape, a T-shape, or a combination thereof.

10. The memory device according to claim 1, wherein a top surface area of the first supporting pillar is greater than or equal to a top surface area of the first contact.

11. A memory device comprising:
a substrate comprising a staircase region and a memory array region, wherein the staircase region comprises a first zone and a second zone;
a stack structure located on the memory array region and the staircase region of the substrate, wherein the stack structure in the memory array region and the first zone of the staircase region comprises a plurality of conductive layers and a plurality of insulating layers stacked alternately on each other, and the stack structure in the second zone of the staircase region comprises a plurality of sacrificial layers and the plurality of insulating layers stacked alternately on each other;
a plurality of first contacts penetrating the stack structure of the second zone and electrically connected to the substrate; and
a plurality of first supporting pillars disposed apart from each other by a non-zero distance at a boundary between the first zone and the second zone and penetrating the stack structure, wherein the plurality of sacrificial layers of the stack structure of the second zone between two adjacent first supporting pillars are in contact with the plurality of conductive layers of the stack structure of the first zone.

12. The memory device according to claim 11, wherein the plurality of first supporting pillars are arranged in a same row.

13. The memory device according to claim 11, wherein the plurality of sacrificial layers of the stack structure at the boundary have an uneven sidewall.

14. The memory device according to claim 11, wherein the plurality of sacrificial layers of the stack structure at the boundary have an arc-shaped sidewall.

15. The memory device according to claim 11, wherein a sidewall of the plurality of sacrificial layers of the stack structure at the boundary is recessed toward the plurality of first contacts.

16. The memory device according to claim 11, further comprising:
a plurality of second supporting pillars penetrating the stack structure in the first zone and spaced part from each other by a non-zero distance; and
a plurality of second contacts connected to the plurality of conductive layers of the stack structure in the first zone, wherein sides of the plurality of second contacts are surrounded by the plurality of first supporting pillars and the plurality of second supporting pillars.

17. The memory device according to claim 16, wherein the plurality of first supporting pillars and the plurality of second supporting pillars have a cross-shape, a T-shape, or a combination thereof.

18. The memory device according to claim 16, wherein a distance between the first supporting pillar and the second contact which are adjacent to each other is less than a distance between two adjacent second contacts.

19. The memory device according to claim 16, wherein an insulating slit which penetrates the stack structure is not provided between the plurality of first contacts and the plurality of second contacts.

20. The memory device according to claim 16, wherein a sum of top surface areas of the plurality of first supporting pillars and the plurality of second supporting pillars is greater than or equal to a sum of top surface areas of the plurality of second contacts.

* * * * *